(12) United States Patent
Takada et al.

(10) Patent No.: US 6,335,223 B1
(45) Date of Patent: Jan. 1, 2002

(54) METHOD FOR PRODUCING A RESIN-SEALED SEMICONDUCTOR DEVICE

(75) Inventors: Kouji Takada, Kameoka; Masami Yokozawa, Yawata; Hiroyoshi Yoshida, Mukou; Shigeki Sakaguchi, Nagaokakyo, all of (JP)

(73) Assignee: Matsushita Electronics Corporation (JP)

( * ) Notice: Subject to any disclaimer, the term of this patent is extended or adjusted under 35 U.S.C. 154(b) by 0 days.

(21) Appl. No.: 09/339,422

(22) Filed: Jun. 24, 1999

Related U.S. Application Data

(62) Division of application No. 09/009,232, filed on Jan. 20, 1998, now Pat. No. 6,215,174.

(30) Foreign Application Priority Data

Jan. 20, 1997 (JP) .................................... 9-007610

(51) Int. Cl.[7] ........................ H01L 21/44; H01L 21/48; H01L 21/50
(52) U.S. Cl. ........................ 438/111; 438/112; 438/123; 438/124; 438/127
(58) Field of Search .................................. 438/111, 112, 438/123, 124, 127

(56) References Cited

U.S. PATENT DOCUMENTS

| | | | |
|---|---|---|---|
| 4,680,613 A | | 7/1987 | Daniels et al. |
| 4,994,412 A | * | 2/1991 | Kalfus et al. |
| 5,250,841 A | | 10/1993 | Sloan et al. |
| 5,387,814 A | | 2/1995 | Baudouin |
| 5,399,905 A | | 3/1995 | Honda et al. |
| 5,459,350 A | | 10/1995 | Date et al. |
| 5,530,284 A | | 6/1996 | Bailey et al. |
| 5,643,835 A | * | 7/1997 | Chia et al. |
| 5,841,187 A | | 11/1998 | Sugimoto et al. |
| 6,104,083 A | * | 8/2000 | Ito et al. |

FOREIGN PATENT DOCUMENTS

| JP | 63-273324 | 11/1988 |
|---|---|---|
| JP | 3-90454 | 9/1991 |

\* cited by examiner

*Primary Examiner*—John F. Niebling
*Assistant Examiner*—Josetta Jones
(74) *Attorney, Agent, or Firm*—Snell & Wilmer L.L.P.

(57) ABSTRACT

A lead frame used for a resin-sealed semiconductor device includes a die-mount portion on which a semiconductor chip rests; and a plurality of leads arranged along a common portion of the lead frame. The plurality of leads include at least one adjusting lead, and the adjusting lead has a length that is less than the others of the plurality of leads such that a tip of the adjusting lead is sufficiently proximate to an outer peripheral surface of a resin-seal body to prevent resin flash during a formation of the semiconductor device and to allow the adjusting lead to be removed after the resin-seal body is formed over a portion of the lead frame.

17 Claims, 27 Drawing Sheets

QFP TYPE

METHOD FOR PRODUCING A RESIN-SEALED SEMICONDUCTOR DEVICE

CROSS-REFERENCE TO RELATED APPLICATIONS

This application is a divisional application of U.S. Ser. No. 09/009,232, filed Jan. 20, 1998, now U.S. Pat. No. 6,215,174.

BACKGROUND OF THE INVENTION

1. FIELD OF THE INVENTION

The present invention relates to a lead frame having at least two leads and usable for resin-sealing a semiconductor chip, a mold for producing a resin-sealed semiconductor device using such a lead frame, a resin-sealed semiconductor device using such a lead frame, and a method for producing a resin-sealed semiconductor device using such a lead frame.

2. DESCRIPTION OF THE RELATED ART

Recently, semiconductor devices have an increased number of pins used for electrodes in accordance with an increase in complexity of the circuit structure mounted therein, the incorporation of various devices into a system, and the diversification of uses. The withstanding voltage characteristic (hereinafter, referred to as the "withstanding voltage") of semiconductor devices has been increased. Therefore, a significantly high voltage may be applied between adjacent leads of a semiconductor device. Accordingly, the distance between such adjacent leads needs to be increased. For example, the minimum possible distance between two adjacent leads is generally considered to be 5 mm in the case of a semiconductor device having a withstanding voltage of 600 V. Such a trend in development requires development of special packages for semiconductor devices and new production facilities, which results in a higher cost for the semiconductor devices.

As one proposal for coping with the above-mentioned development trend, common use of components such as packages and lead frames for semiconductors having different specifications have been researched.

FIG. 29 is a plan view of a conventional lead frame 1 for resin-sealing a semiconductor chip 2. The lead frame 1 includes five leads, namely, two leads 1a, two leads 1b and one lead 1c.

The semiconductor chip 2 is resin-sealed using the lead frame 1 in the following manner.

The semiconductor chip 2 is bonded on a dismount portion 1d of the lead frame 1, and the semiconductor chip 2 is connected to the leads 1a via thin metal wires 3. The semiconductor chip 2 and the lead frame 1 are resin-sealed in a resin-seal body 6 except for the outer ends of the five leads 1a, 1b and 1c. Then, the lead 1c which is not connected to the semiconductor chip 2 is cut along an outer peripheral surface of the resin-seal body 6 by appropriate machining.

Conventionally, a common lead frame is used for resin-sealing semiconductor chips having different manners of wire connection in order to allow for use of a common mold. After the semiconductor chip is resin-sealed, the unnecessary lead (such as 1c) which is not connected to the semiconductor chip is cut off in an appropriate manner. Consequently, circuits having complicated structures are produced with relative ease.

However, in the manner of resin-sealing described with reference to FIG. 29, after the unnecessary lead 1c is cut off, a part 1c' thereof is left on the outer peripheral surface of the resin-seal body 6. During the flow-soldering or dip-soldering performed subsequent to the resin-seal, solder H adheres to the part 1c'. This causes the part 1c' to be a separate conductive part existing between the two respective leads 1a, resulting in potential electric connection of the two leads 1a to each other. When such a phenomenon (the solder adherence) gets too large, the withstanding voltage of the semiconductor device is lowered and sometimes the device does not function.

As the number of pins connected to a semiconductor chip increases, the distance between two adjacent leads is decreased. As the withstanding voltage of a semiconductor device rises, the voltage applied between the leads also rises. In order to cope with such a trend, a sufficient withstanding voltage should be obtained between the shortened lead distance.

In order to prevent the withstanding voltage between leads from decreasing, a lead frame and a mold specially used for each of various types of semiconductor devices are used. This raises the cost of the molds and also increases the number of mold replacements, thus raising the production cost of the semiconductor devices.

SUMMARY OF THE INVENTION

According to one aspect of the invention, a lead frame used for a resin-sealed semiconductor device includes a die-mount portion on which a semiconductor chip rests; and a plurality of leads arranged along a common portion of the lead frame. The plurality of leads include at least one adjusting lead, and the adjusting lead has a length that is less than the others of the plurality of leads such that a tip of the adjusting lead is sufficiently proximate to an outer peripheral surface of a resin-seal body to prevent resin flash during a formation of the semiconductor device and to allow the adjusting lead to be removed after the resin-seal body is formed over a portion of the lead frame.

In one embodiment of the invention, the adjusting lead projects into the resin-seal body.

In one embodiment of the invention, the tip of the adjusting lead is tapered.

In one embodiment of the invention, the tip of the adjusting lead is squared.

In one embodiment of the invention, the adjusting lead has a length that is less than the others of the plurality of leads such that a tip of the adjusting lead is located at one of a position outside an outer peripheral surface of the resin-seal body and a position in contact with the outer peripheral surface of the resin-seal body during a formation of the semiconductor device.

In one embodiment of the invention, the tip of the adjusting lead is squared.

In one embodiment of the invention, an end surface of the tip of the adjusting lead and the outer peripheral surface of the resin-seal body is substantially parallel to each other.

In one embodiment of the invention, one or more of the leads other than the adjusting lead has a shape for preventing the one or more leads from removing from the resin-seal body after the resin-seal body is formed over the portion of the lead frame.

In one embodiment of the invention, the lead frame further includes a tie-bar for transversely connecting the plurality of leads, thereby substantially preventing a bending of the plurality of leads.

According to another aspect of the invention, a lead frame used for a resin-sealed semiconductor device includes a die-mount portion on which a semiconductor chip rests; a plurality of leads which are arranged along a common portion of the lead frame, wherein at least two of the plurality of leads are spaced apart from each other a predetermined distance, wherein the predetermined distance is at least twice a distance between the others of the plurality of leads; a tie-bar for transversely connecting the plurality of leads, thereby substantially preventing a bending of the plurality of leads.

According to still another aspect of the invention, a mold for producing a resin-sealed semiconductor device using a lead frame is provided. The lead frame includes a plurality of leads arranged along at least one outer peripheral surface of the mold. The plurality of leads include at least one adjusting lead. The adjusting lead projects into the mold a predetermined distance which is sufficiently small to allow the adjusting lead to be easily removed from the resin-sealed semiconductor without resin flash after the resin-sealed semiconductor is formed. The mold has a part for holding the adjusting lead and extending to a vicinity of the tip of the adjusting lead during a formation of the semiconductor device.

According to still another aspect of the invention, a resin-sealed semiconductor device produced using a lead frame is provided, in which the resin-sealed semiconductor device includes a resin-seal body surrounding a portion of the lead frame for protecting a semiconductor chip thereon. The lead frame includes a plurality of leads arranged along at least one outer peripheral surface of the resin-seal body. The plurality of leads include at least one adjusting lead, which projects into the resin-seal body a sufficiently small distance to allow the adjusting lead to be removed. The outer peripheral surface has a recess from which the adjusting lead is removed during a formation of the semiconductor device.

In one embodiment of the invention, a part of the outer peripheral surface defining the recess is formed of an insulative material for insulating two of the plurality of leads which have the recess therebetween.

In one embodiment of the invention, a creeping distance of the part formed of the insulative material is larger than a minimum distance between the two leads which have the recess therebetween.

According to still another aspect of the invention, a resin-sealed semiconductor device produced using a lead frame is provided, in which the resin-sealed semiconductor device includes a resin-seal body surrounding a portion of the lead frame for protecting a semiconductor chip thereon. The lead frame includes a plurality of leads arranged along at least one outer peripheral surface of the resin-seal body. The plurality of leads include at least one adjusting lead. The adjusting lead has a tip facing the outer peripheral surface, wherein the tip is outside the outer peripheral surface of the resin-seal body. The outer peripheral surface has a projection in contact with the tip of the adjusting lead during a formation of the semiconductor device.

According to still another aspect of the invention, a resin-sealed semiconductor device produced using a lead frame is provided, in which the resin-sealed semiconductor device includes a resin-seal body surrounding a portion of the lead frame for protecting a semiconductor chip thereon. The lead frame includes a plurality of lead which are arranged along a common portion of the lead frame. At least two of the plurality of leads are spaced apart from each other a predetermined distance. The predetermined distance is at least twice a distance between the others of the plurality of leads. The lead frame further includes a tie-bar for transversely connecting the plurality of leads, thereby substantially preventing a bending of the plurality of leads. The outer peripheral surface has a projection in contact with the tie-bar during a formation of the semiconductor device.

According to still another aspect of the invention, a method for producing a resin-sealed semiconductor device is provided. The method includes the step of incorporating a portion of the lead frame in a mold for producing a resin-seal body which surrounds the portion of the lead frame in the resin-seal body, the lead frame including a plurality of leads arranged along at least one outer peripheral surface of the mold. The plurality of leads include at least one adjusting lead, and the adjusting lead has a length that is less than the others of the plurality of leads such that a tip of the adjusting lead is sufficiently proximate to an outer peripheral surface of the resin-seal body to prevent resin flash during a formation of the semiconductor device and to allow the adjusting lead to be removed after the resin-seal body is formed over the portion of the lead frame. The method further includes the steps of resin-sealing the semiconductor device together with the portion of the lead frame by the mold to form a resin-seal body; taking out the resin-seal body from the mold; and removing the at least one adjusting lead from the resin-seal body.

In one embodiment of the invention, the method further includes the step of cutting the plurality of leads. The adjusting lead of the lead frame projects into the resin-seal body.

A resin-sealed semiconductor device produced by such a method is provided.

In one embodiment of the invention, the method further includes the step of cutting the plurality of leads. A tip of the adjusting lead is located at one of a position outside the outer peripheral surface of the resin-seal body and a position in contact with the outer peripheral surface of the resin-seal body.

A resin-sealed semiconductor device produced by such a method is provided.

According to still another aspect of the invention, a method for producing a resin-sealed semiconductor device is provided. The method includes the steps of incorporating a portion of the lead frame in a mold for producing a resin-seal body which surrounds the portion of the lead frame in the mold. The lead frame including a plurality of leads arranged along at least one outer peripheral surface of the resin-seal body and a tie-bar for transversely connecting the plurality of leads, thereby substantially preventing a bending of the plurality of leads. The method further includes the steps of resin-sealing the semiconductor device together with the portion of the lead frame by the mold to form a resin-seal body having a projection of the other peripheral surface that contacts the tie-bar; taking out the resin-seal body from the mold; and removing the tie-bar to leave the projection on the outer peripheral surface of the resin-seal body.

A resin-sealed semiconductor device produced by such a method is provided.

Thus, the invention described herein makes possible the advantages of (1) providing a lead frame having leads commonly usable for different types of semiconductors without leaving a protruding portion associated with a cutting operation and thus avoiding deterioration of the withstanding voltage of the semiconductor devices, a mold used for resin-sealing a semiconductor chip using such a lead frame, a resin-sealed semiconductor device using such a lead frame, and a method for producing a resin-sealed semiconductor device using such a lead frame; and (2) providing a lead frame allowing lead arrangement to be changed in accordance with the type of semiconductor device, a mold used for resin-sealing a semiconductor chip using such a lead frame, a resin-sealed semiconductor device using such a lead frame, and a method for producing a resin-sealed semiconductor device using such a lead frame.

These and others advantages of the present invention will become apparent to those skilled in the art upon reading and understanding the following detailed description with reference to the accompanying figures.

BRIEF DESCRIPTION OF THE DRAWINGS

FIG. 15B is a plan view of the resultant resin-sealed semiconductor device after the common portion of the lead frame is cut off and the adjusting lead is removed in the second example;

DESCRIPTION OF THE PREFERRED EMBODIMENTS

Hereinafter, the present invention will be described by way of illustrative examples with reference to the accompanying drawings.

EXAMPLE 1

A lead frame in a first example according to the present invention will be described with reference to figures.

Figure 1:
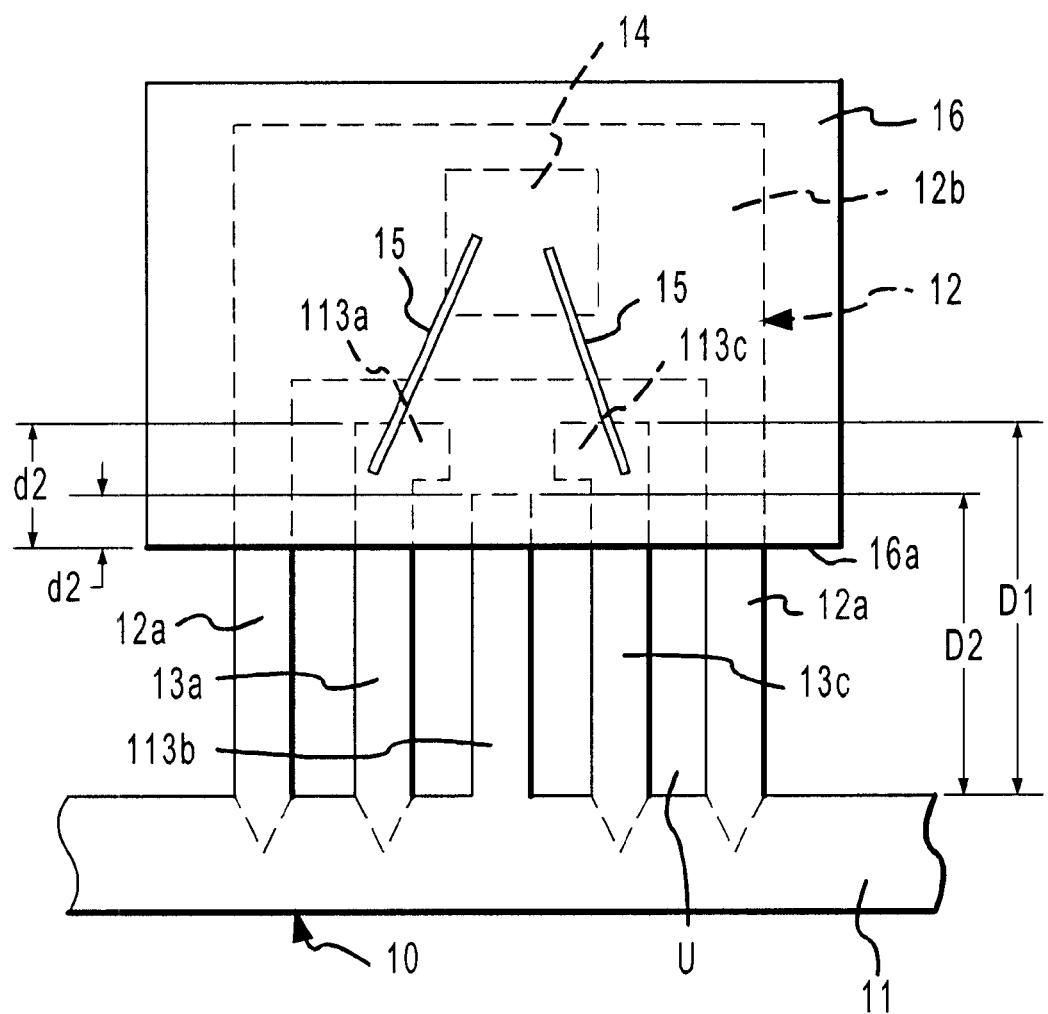
FIG. 1 is a plan view of a resin-sealed semiconductor device with a lead frame in a first example according to the present invention.

FIG. 1 is a plan view of a resin-sealed semiconductor chip 14 with a lead frame 10 in the first example according to the present invention. The semiconductor chip 14 is resin-sealed in a resin-seal body 16 to electrically insulate the semiconductor chip 14.

The lead frame 10 includes a strip-shaped common portion 11 and a generally C-shaped electrode pin section 12 having a die-mount portion 12b and two leads 12a extending from the die-mount portion 12b. In a space U defined by the generally C-shaped electrode pin section 12 and the common portion 11, the lead frame 10 further includes two leads 13a and 13c projecting from the common portion 11 and located between the leads 12a, and an adjusting lead 113b also projecting from the common portion 11 and located between the leads 13a and 13c.

The leads 13a and 13c are connected to the semiconductor chip 14 (which is bonded to the die-mount portion 12b) via thin metal wires 15. A distance D2, which represents the distance the adjusting lead 113b projects from the common portion 11, is shorter than a distance D1, which represents the distance the leads 13a and 13c project from the common portion 11. Namely, D2<D1.

The resin-seal body 16 is formed by resin-molding the semiconductor chip 14, the lead frame 10, and the thin metal wires 15 while leaving leg portions of the leads 12a, 13a, 113b and 13c and the common portion 11 outside.

A distance d2, which represents the distance the adjusting lead 113b projects into the resin-seal body 16, is shorter than a distance d1, which represents the distance the leads 13a and 13c project into the resin-seal body 16. Namely, d2<d1.

The adjusting lead 113b projects into the resin-seal body 16 from an outer peripheral surface 16a of the resin-seal body 16 by such a distance (d2) as to allow the adjusting lead 113b to be removed (e.g., pulled out) from the resin-seal body 16 after the resin-sealing is completed. Such a distance (sufficiently proximate) is preferably about 1 mm to about 1.2 mm. Although this range is preferred, any distance can be used as long as the adjusting lead 113b is removed from the resin-seal body 16 with sufficient ease.

Herein, the expression "with sufficient ease" has two meanings.

First, the expression "with sufficient ease" refers to a degree to which the resin-seal body 16 and the semiconductor chip 14 are not mechanically damaged when the adjusting lead 113b is removed. For example, in the case where the adjusting lead 113b is bent (like, for example, the leads 13a and 13c) for preventing the lead 113b from being pulled out, the resin-seal body 16 is mechanically damaged when the adjusting lead 113b is pulled out.

Furthermore, the resin-seal body 16 needs to protect the semiconductor chip 14 after the adjusting lead 113b is removed. For example, when the adjusting lead 113b is excessively long, the distance between the tip of the adjusting lead 113b and the die-mount portion 12b is too small to avoid cracking of the resin-seal body 16 in this portion. The resin-seal body 16 in such a state is less protective for the semiconductor chip 14.

Secondary, the expression "with sufficient ease" refers to a degree to which the adjusting lead 113b is removed when the outer end of the adjusting lead 113b is pulled but does not come out by slight vibration or unintentional contact during the transportation of the semiconductor device. The adjusting lead 113b should be removed only in a prescribed step in order to avoid the situation in which a great number of adjusting leads come out during another production step and become garbage. By avoiding such a situation, the garbage is collected and processed only at a prescribed site. In addition, adjusting leads will not undesirably interfere with other production steps.

With reference to FIGS. 2A, 2B, 3A, 3B, 3C, 4A, 4B, and 5, a method for resin-sealing the semiconductor chip 14 using the lead frame 10 will be described. Identical elements previously discussed with respect to FIG. 1 will bear identical reference numerals therewith and the descriptions thereof will be omitted.

Figures 2A, 2B:
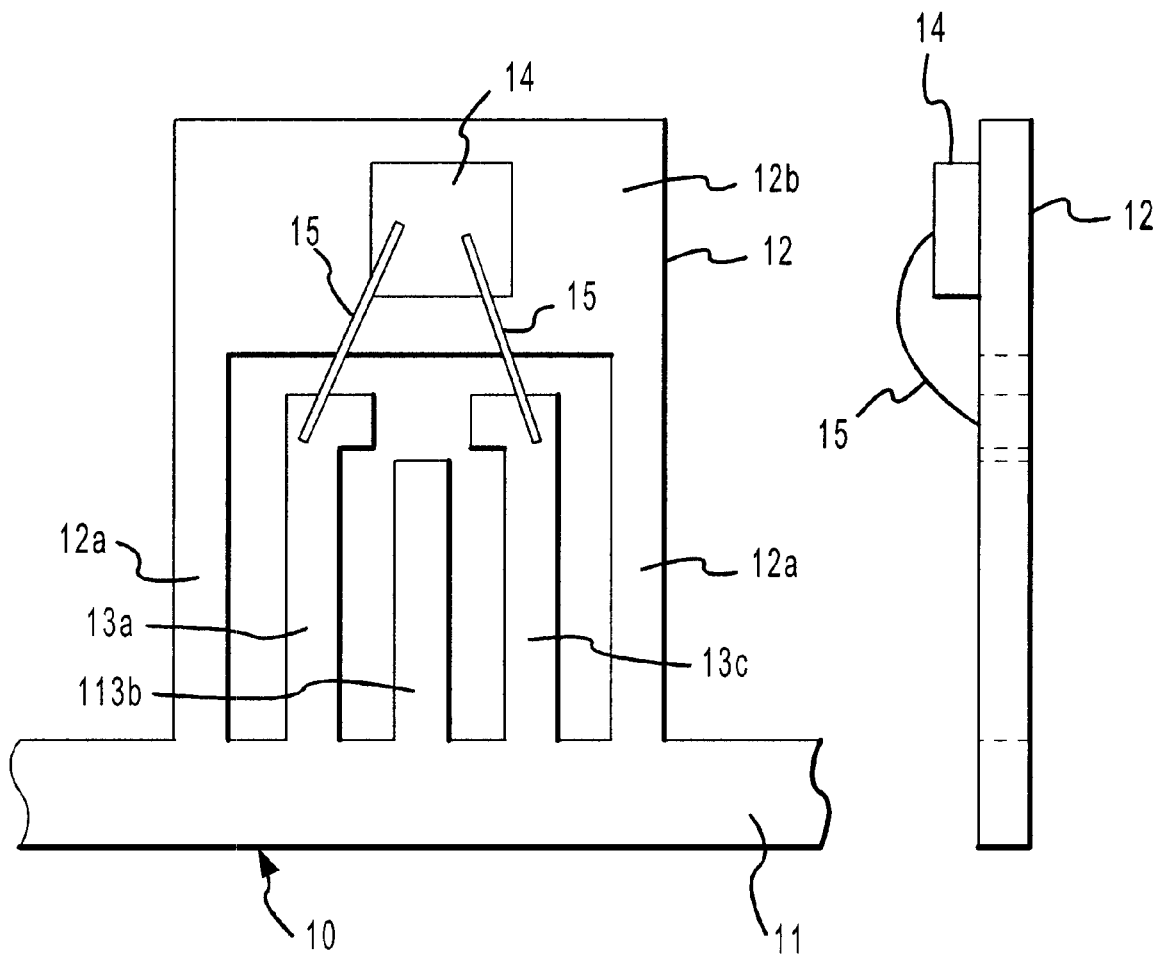
FIG. 2A is a plan view of a semiconductor chip bonded on the lead frame before being resin-sealed in the first example.
FIG. 2B is a side view of the semiconductor chip and the lead frame shown in FIG. 2A.
Figures 3A, 3B:
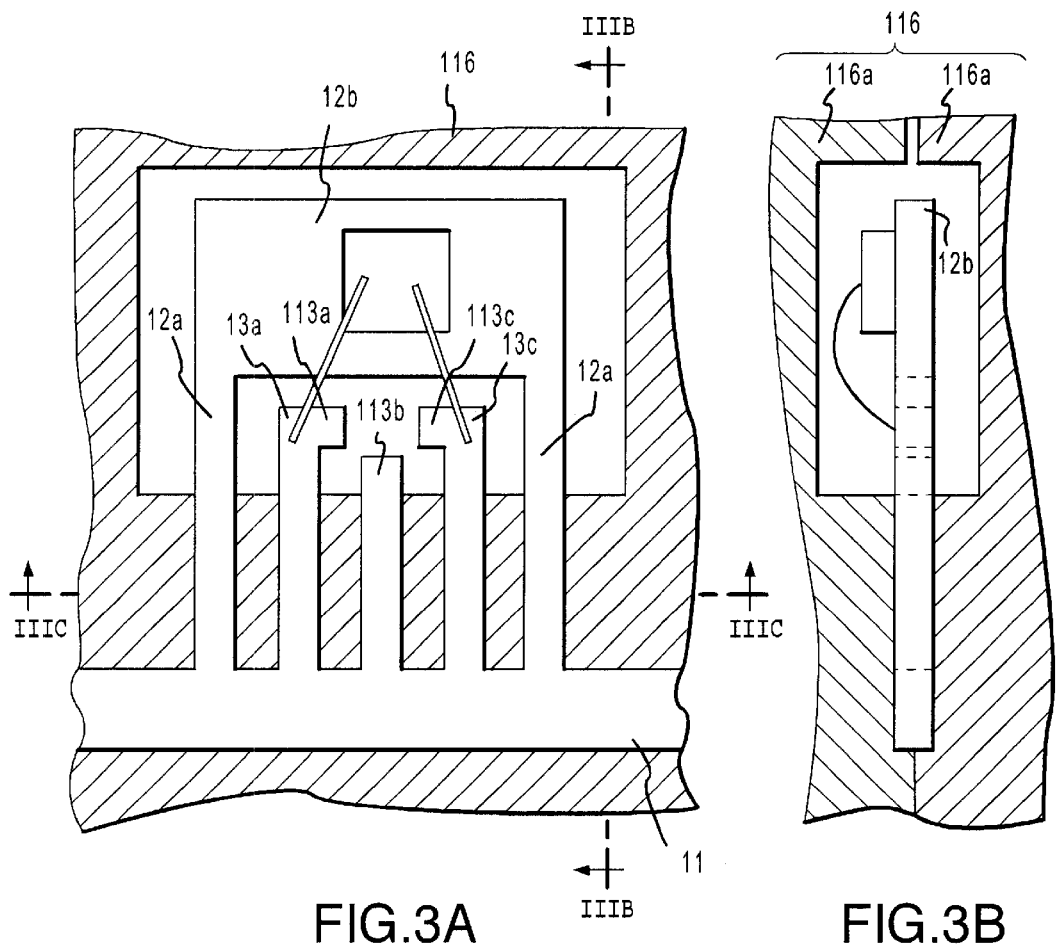
FIG. 3A is a plan view of a mold holding the semiconductor chip bonded on the lead frame during resin-sealing in the first example.
FIG. 3B is a cross-sectional view of FIG. 3A taken along line IIIB—IIIB.
Figure 3C:
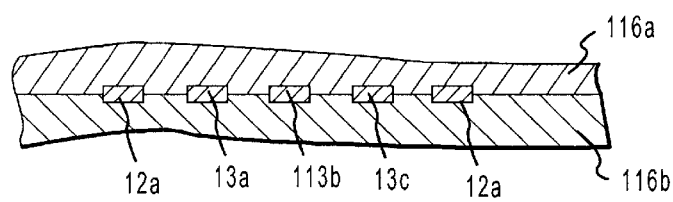
FIG. 3C is a cross-sectional view of FIG. 3A taken along line IIIC—IIIC.
Figure 4A:
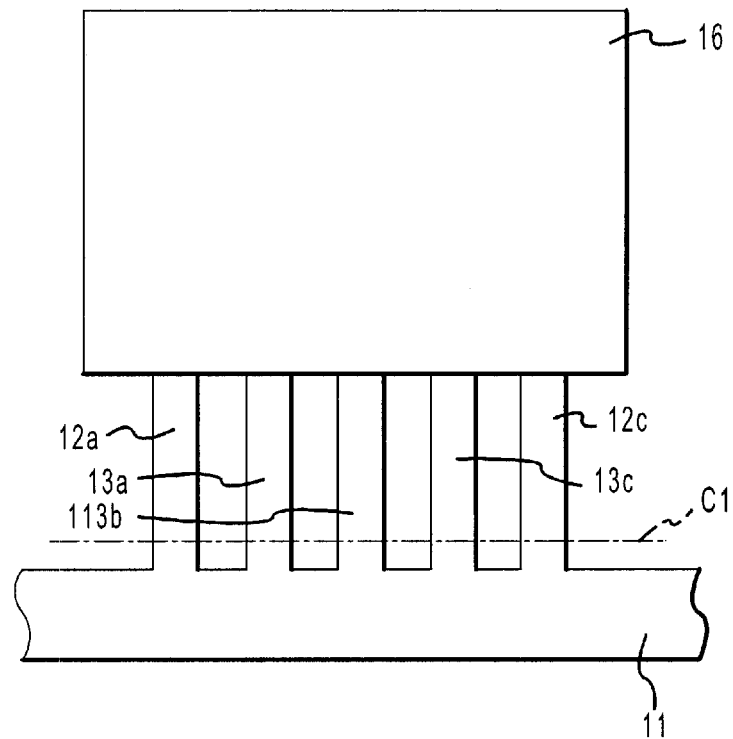
FIG. 4A is a plan view of the resin-seal body and the lead frame subsequent to being formed in the mold in the first example.
Figure 4B:
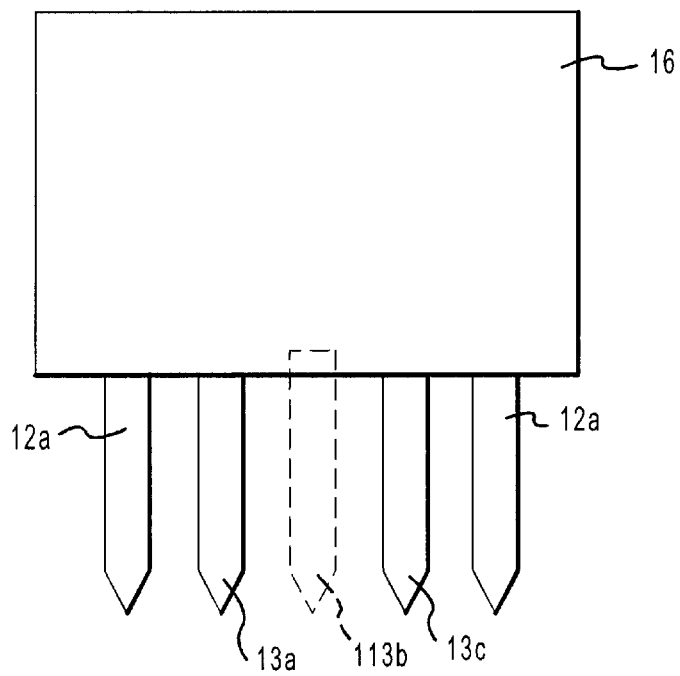
FIG. 4B is a plan view of a resultant resin-sealed semiconductor device after the common portion of the lead frame is cut off and the adjusting lead is removed in the first example.
Figure 5:
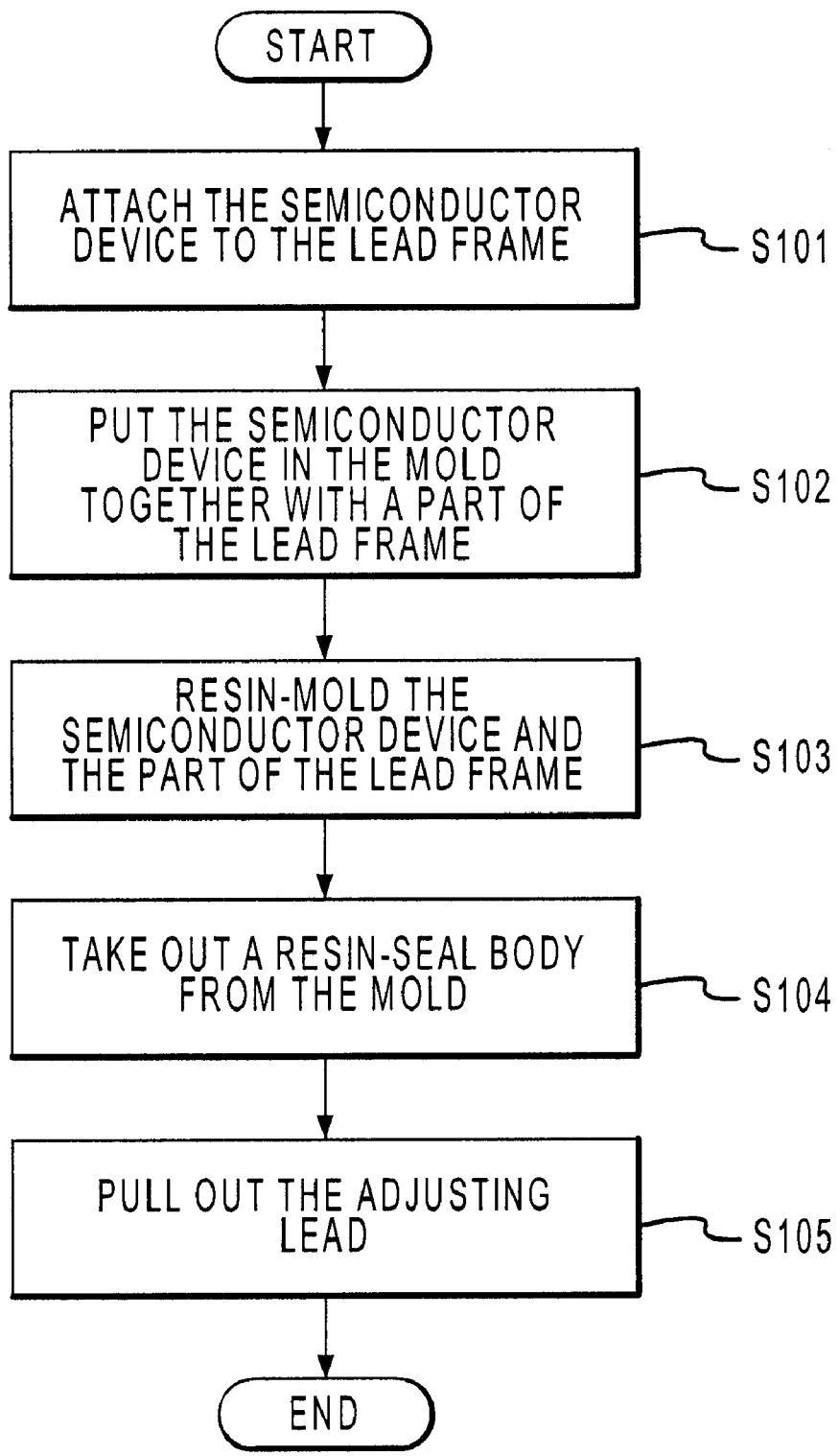
FIG. 5 is a flowchart illustrating a method for resin-sealing the semiconductor using the lead frame in the first example.

FIG. 2A is a plan view of the semiconductor chip 14 bonded on the lead frame 10 before being resin-sealed, and FIG. 2B is a side view of the semiconductor chip 14 and the lead frame 10 shown in FIG. 2A. FIG. 3A is a plan view of a mold 116 where an inside portion of the mold 116 is shown to illustrate a lead frame portion inside the mold 116 (hereinafter, referred to as a "plan view".) As shown in FIG. 3A, the semiconductor chip 14 is bonded on the lead frame 10 held by the mold 116 during resin-sealing, FIG. 3B is a cross-sectional view thereof taken along line IIIB—IIIB of FIG. 3A, and FIG. 3C is a cross-sectional view thereof taken along line IIIC—IIIC of FIG. 3A. FIG. 4A is a plan view of the resin-seal body 16 with the lead frame 10 subsequent to being formed in the mold 116, and FIG. 4B is a plan view of a resultant resin-sealed semiconductor device after the common portion 11 of the lead frame 10 is cut off and the adjusting lead 113b is pulled out. FIG. 5 is a flowchart illustrating a method for resin-sealing the semiconcutor 14 using the lead frame 10.

Hereinafter, the method for resin-sealing the semiconductor chip 14 using the lead frame 10 will be described in accordance with FIG. 5 with reference to FIGS. 2A, 2B, 3A, 3B, 3C, 4A and 4B.

In step S101, the semiconductor chip 14 is attached to the die-mount portion 12b (FIGS. 2A and 2B). The semiconductor chip 14 is connected to the leads 13a and 13c via the thin metal wires 15.

In step S102, resin-sealing of the semiconductor chip 14 is performed using the mold 116 including an upper mold 116a and a lower mold 116b which can be engaged together. As shown in FIGS. 3A, 3B and 3C, the semiconductor chip 14 and the die-mount portion 12b are held between the upper mold 116a and the lower mold 116b. The leads 12a, 13a and 13c and the adjusting lead 113b are also partially held between the upper mold 116a and the lower mold 116b. In step S103, the semiconductor chip 14 and the above-mentioned parts of the lead frame 10 are molded and sealed together in the resin-seal body 16 by the mold 116.

In step S104, the resin-seal body 16 is taken out of the mold 116 as shown in FIG. 4A. Then, the leads 12a, 13a, 113b and 13c which are projecting from the common portion 11 are cut along chain line C1 so as to have a pierced tip as shown in FIG. 4B.

In step S105, the adjusting lead 113b which is not connected to the semiconductor chip 14 is pulled out from the resin-seal body 16 (FIG. 4B). As described above, the adjusting lead 113b can be pulled out sufficiently easily due to the relatively short distance by which the adjusting lead 113b projects into the resin-seal body 16.

As shown in FIG. 3A, respective ends 113a and 113c of the leads 13a and 13c in the resin-seal body 16 are bent at a right angle for preventing the leads 13a and 13c from being pulled out. The leads 13a and 13c also project into the resin-seal body 16 deeper than the adjusting lead 113b.

As can be appreciated from the above description, the lead frame 10 and the method for producing a resin-sealed semiconductor device in the first example according to the present invention, semiconductor chips having various specifications can be resin-sealed by the common mold 116 and also the adjusting lead 113b which is made unnecessary due to the specifications of the semiconductor can be removed from the resin-seal body 16.

In the lead frame 10 having such a structure, the adjusting lead does not remain in the resin-seal body 16 as does in the case of the conventional lead frame, shortcircuiting is therefore reduced when the semiconductor chip 14 is soldered to the printed circuit board and thus the deterioration in the withstanding voltage of the semiconductor chip 14 is avoided.

The structure of the lead frame is not limited to the one described above. The structure is sufficient as long as the lead frame includes a plurality of leads arranged along at least one outer peripheral surface of the resin-sealed body and at least one of the plurality of leads is an adjusting lead.

Figure 6:
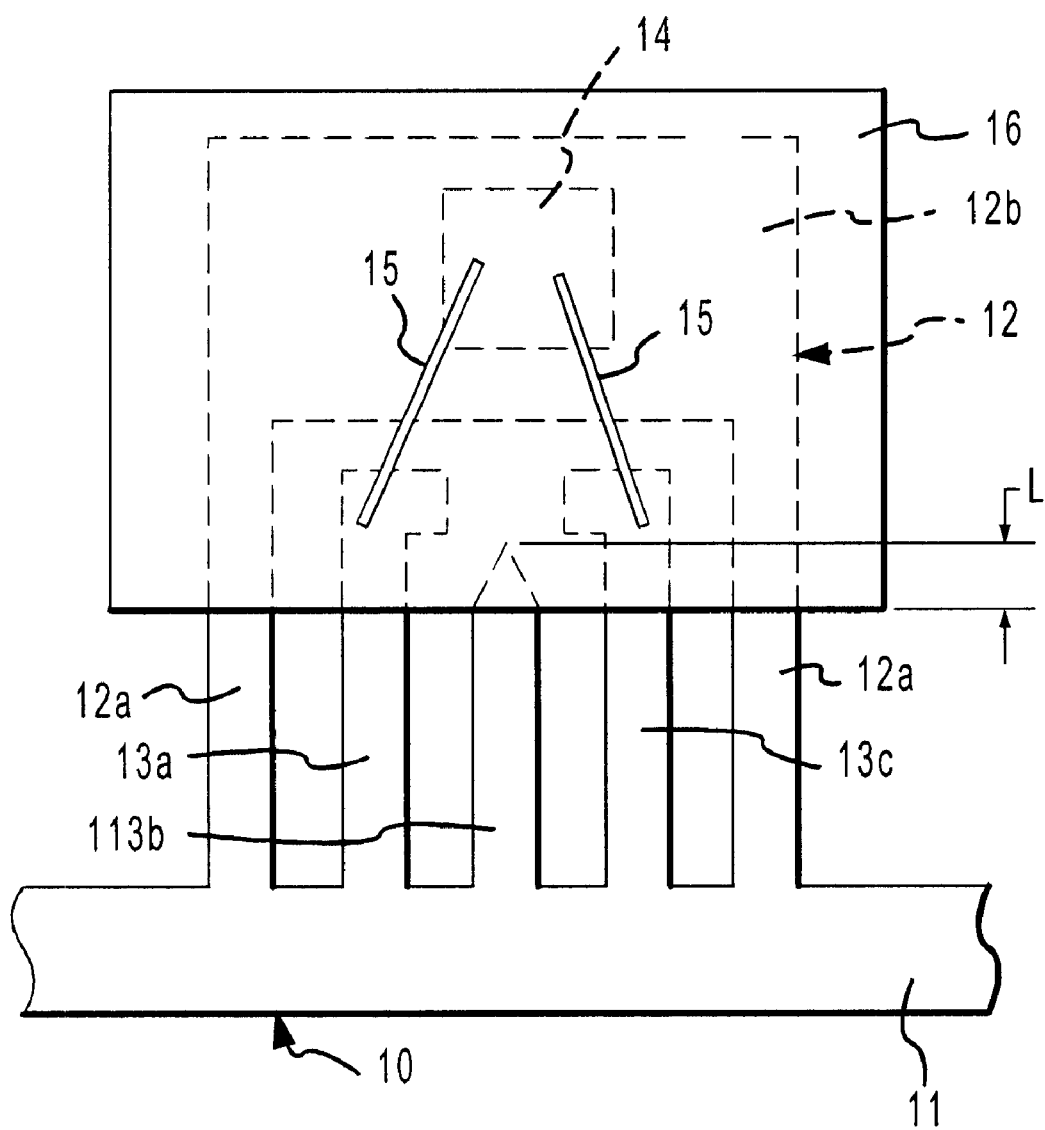
FIG. 6 is a plan view of a resin-sealed semiconductor device with a lead frame in an alternative example of the first example according to the present invention.
Figure 7A:
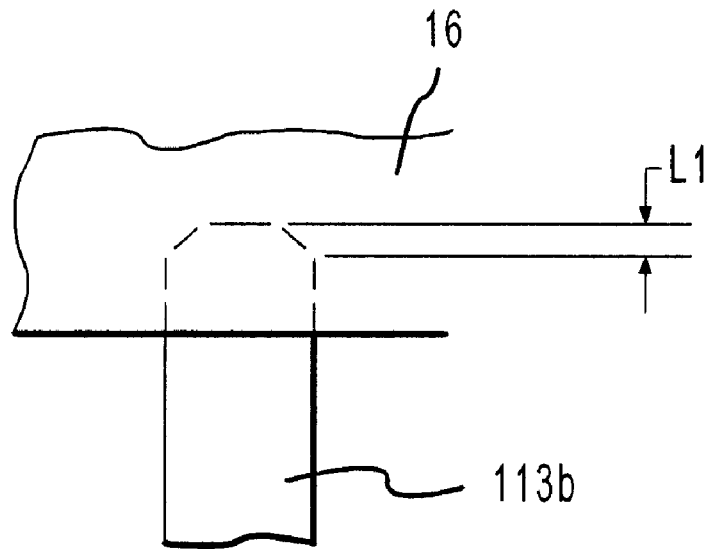
FIGS. 7A and 7B are plan views illustrating the shape of the tip of the adjusting leads shown in FIG. 6.
Figure 7B:
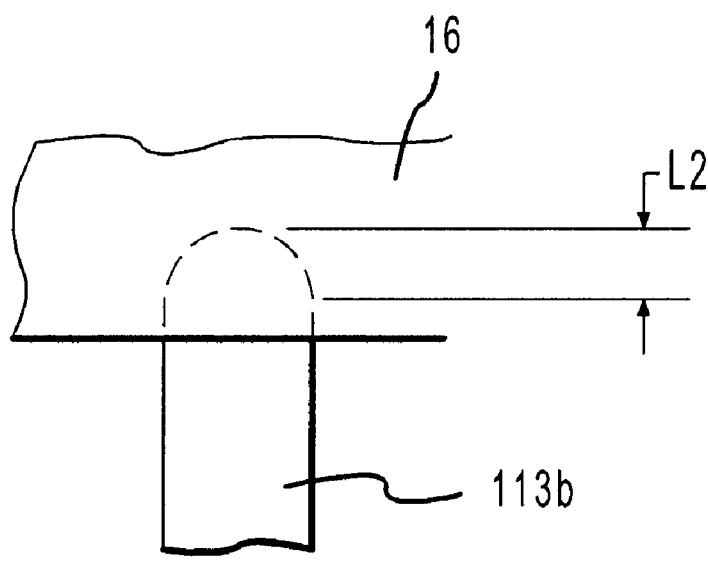

FIG. 6 is a plan view of a resin-sealed semiconductor chip 14 with a lead frame 10 in an alternative example of the first example according to the present invention. FIGS. 7A and 7B are amplified fragmentary plan views illustrating the shape of the tip of the adjusting lead 113b.

The adjusting lead 113b shown in FIG. 1 has a square-shaped tip. The adjusting lead 113b may have an inwardly tapered shape extending into the resin-seal body 16 a distance L as shown in FIG. 6 in order to allow the adjusting lead 113b to be pulled out more easily. The shape of the tip of the lead 113b may be trapezoidal as shown in FIG. 7A or rounded as shown in FIG. 7B.

A length L1 of the tapered part of FIG. 7A and a length L2 of the tapered part in FIG. 7B are each preferably about 0.3 mm to about 0.8 mm. When the lengths L1 and L2 are each more than about 0.8 mm, the adjusting lead 113b is difficult to pull out for the following reasons.

When the lengths L1 and L2 are each more than about 0.8 mm, the contact area between the resin in the resin-seal body 16 and the adjusting lead 113b increases and the adjusting lead 113b reaches deep in the resin-seal body 16, thus becoming stable in the resin-seal body 16 against the transverse vibration. As a result, the friction between the adjusting lead 113b and the resin increases thereby increasing the force required to pull out the adjusting lead 113b.

The cross-sectional shape of the adjusting lead 113b along the outer peripheral surface 16a of the resin-seal body 16 needs to be substantially identical with the cross-sectional shape of each of the other leads 12a, 13a and 13c along the outer peripheral surface 16a. Otherwise, in the case where the tapered part extends outside the outer peripheral surface 16a of the resin-seal body 16; if the cross section of the adjusting lead 113b along the outer peripheral surface 16a is smaller than the cross section of each of the other leads 12a, 13a and 13c along the outer peripheral surface 16a, a space will be formed undesirably between the mold (not shown) and the adjusting lead 113b, resulting in resin flash.

When the lengths L1 and L2 are each less than about 0.3 mm, the effect that the adjusting tip 113b is more easily pulled out is not obtained.

Figure 8:
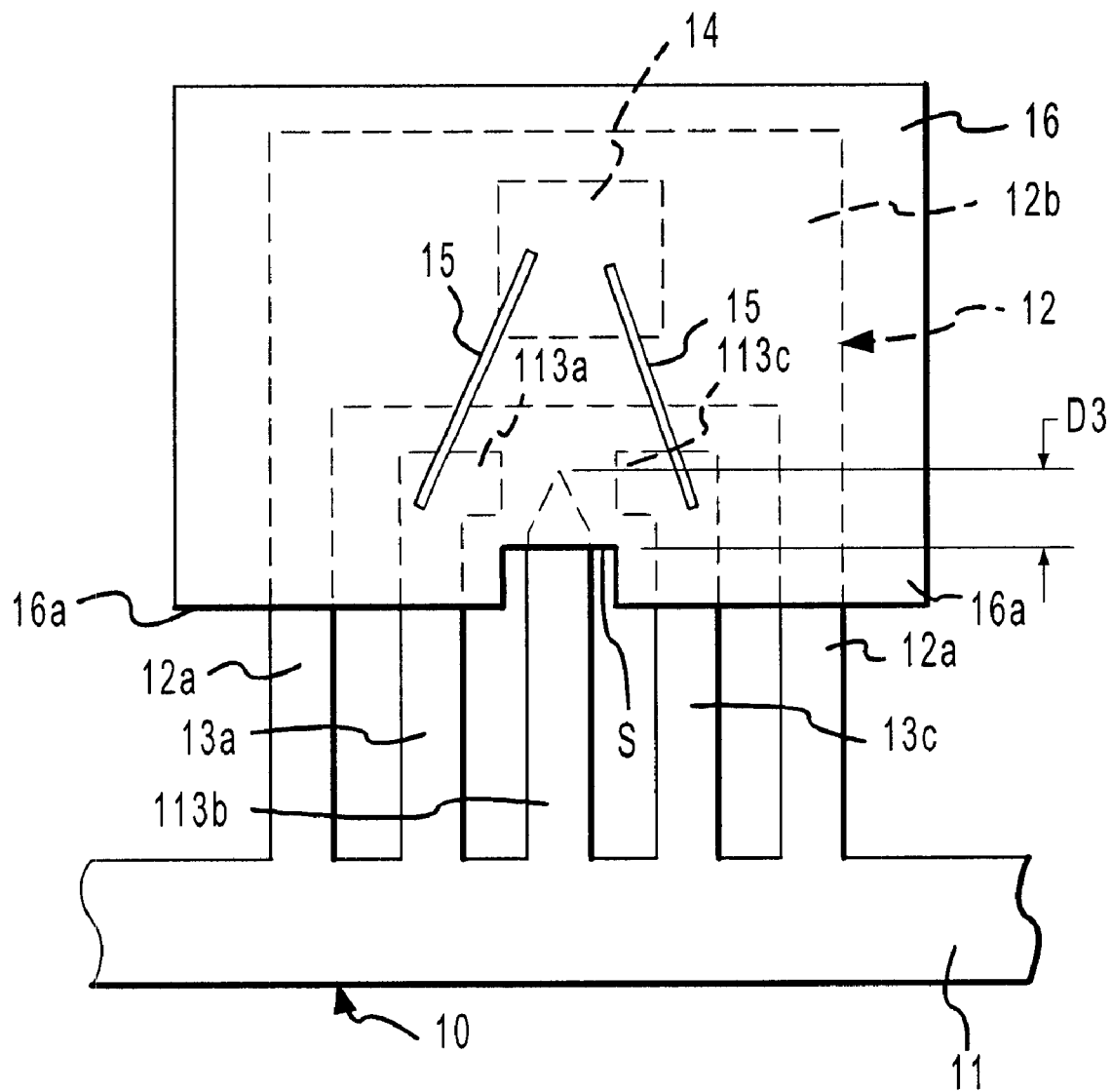
FIG. 8 is a plan view of a resin-sealed semiconductor device with a lead frame in another alternative example of the first example according to the present invention.
Figure 9:
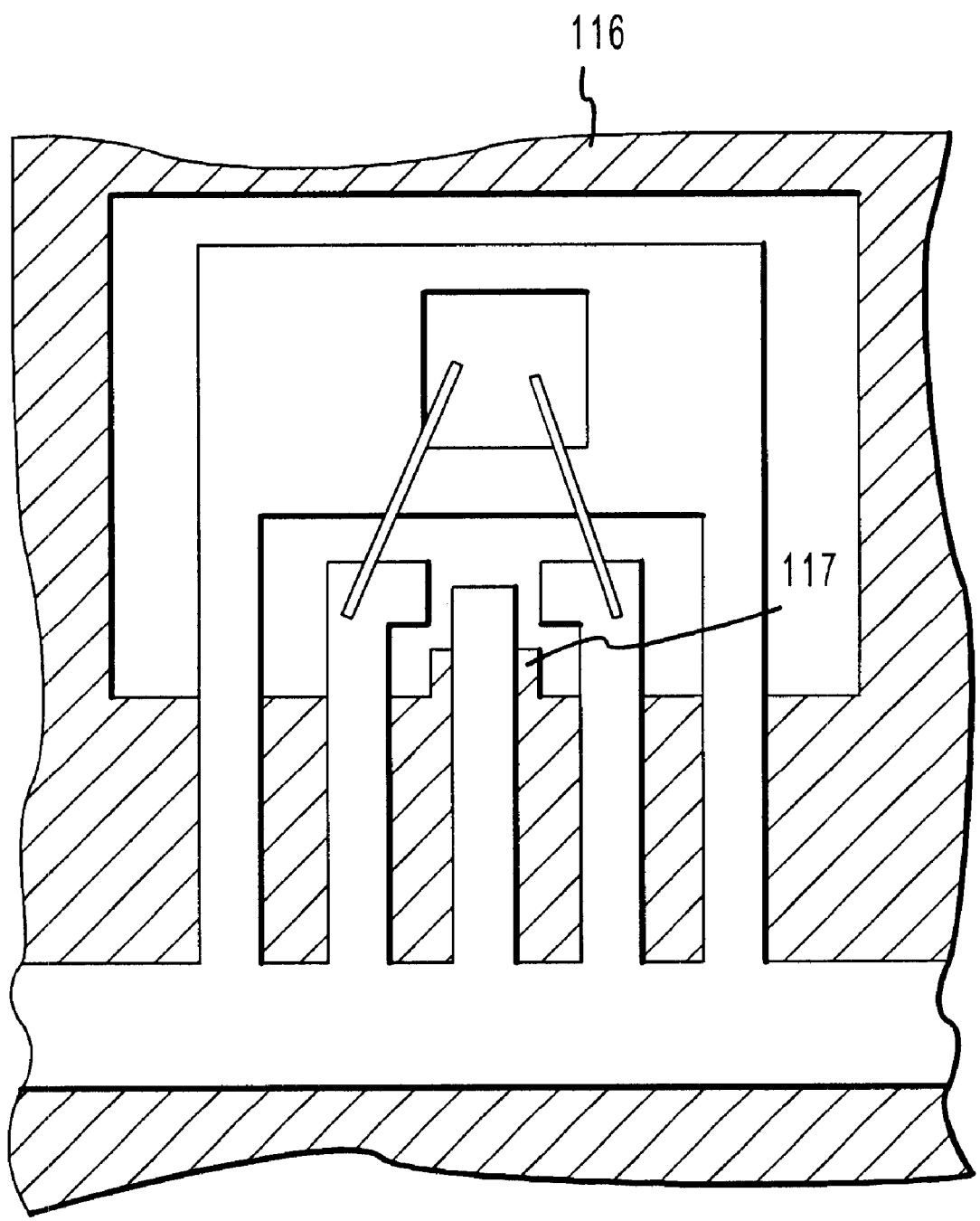
FIG. 9 is a plan view of a mold used for producing the resin-seal body shown in FIG. 8.

FIG. 8 is a plan view of a resin-sealed semiconductor chip 14 with a lead frame 10 in another alternative example of the first example according to the present invention. FIG. 9 is a plan view of a mold 116 used for producing the resin-seal body 16 shown in FIG. 8.

The mold 116 used for resin-molding to produce the resin-seal body 16 includes an upper mold and a lower mold which can be engaged together as described above. In the example shown in FIG. 9, the mold 116 further has holding parts 117 for holding the adjusting lead 113b. The holding parts 117 project to the vicinity of the tip of the adjusting lead 113b.

As shown in FIG. 8, the resin-seal body 16 produced by the mold 116 having the holding parts 117 is recessed as defined by a part S along an outer peripheral surface 16a. The adjusting lead 113b projects into the resin-seal body 16 at the recess S. A distance d3 from the tip end of the adjusting lead 113b to the recessed outer peripheral surface S of the resin-seal body 16 is shorter than that in the example shown in FIG. 1. Accordingly, the adjusting lead 113b is pulled out more easily.

Conversely, the leads 12a, 13a and 13c project deep into the resin-seal body 16 so as not to be pulled out easily. The leads 13a and 13c respectively have bent parts 113a and 113c to avoid being pulled out as described above.

The distance d3 is preferably about 1 mm to about 1.2 mm. When the distance d3 is less than about 1 mm, resin flash could possibly occur if the taper length is 0.8 mm or greater. When the distance d3 is more than about 1.2 mm, the adjusting lead 113b is difficult to pull out.

Figure 10:
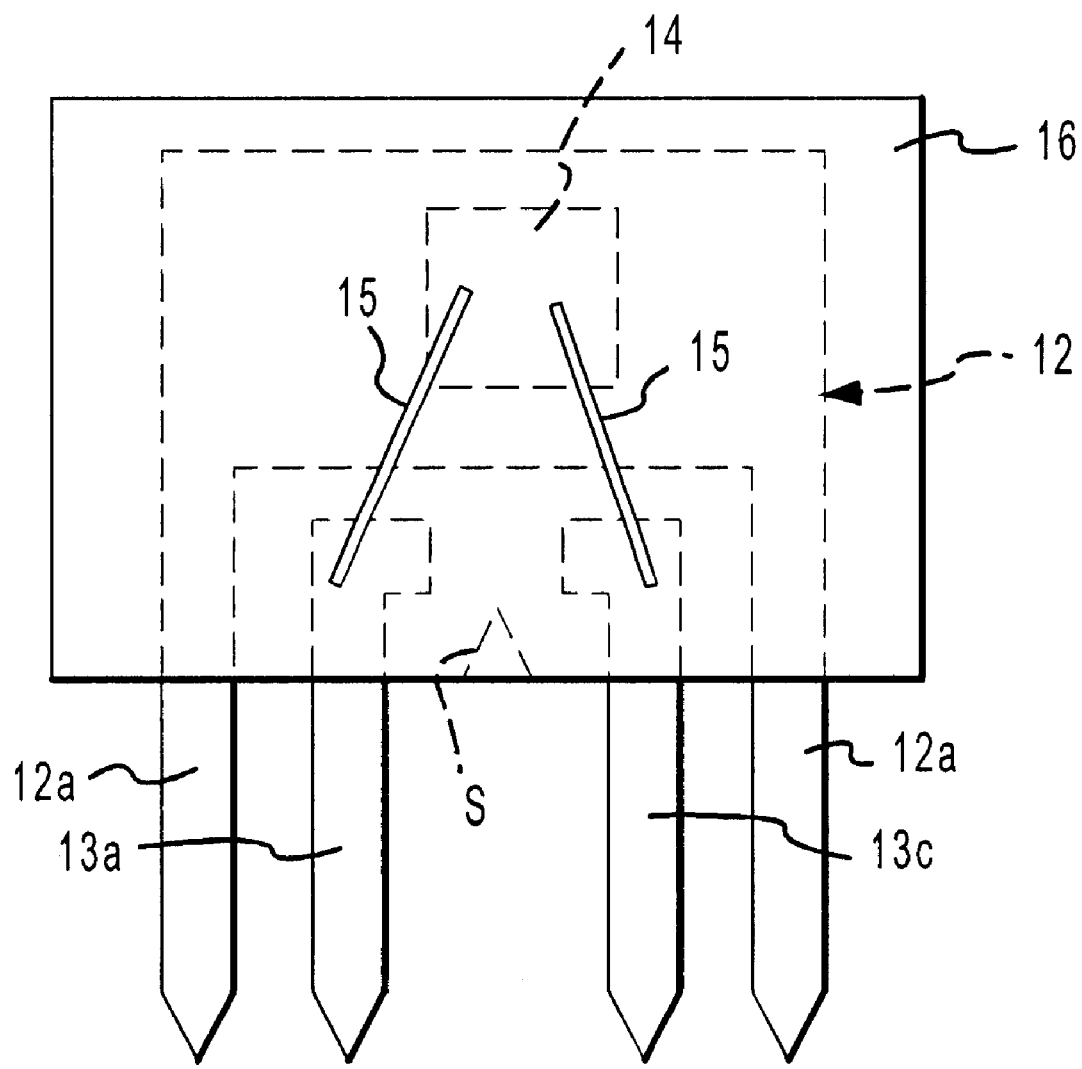
FIG. 10 is a plan view of the resin-sealed semiconductor device shown in FIG. 6 after the common portion of the lead frame is cut off.

FIG. 10 is a plan view of the resin-sealed semiconductor chip 14 with the lead frame 10 shown in FIG. 6 after the lead frame 10 is cut off.

As can be appreciated from FIG. 10, the common portion 11 is cut off from the leads 12a, 13a, 113b and 13c after the semiconductor chip 14 is resin-sealed. The adjusting lead 113b has been pulled off from the resin-seal body 16 and therefore is deleted.

Figure 11:
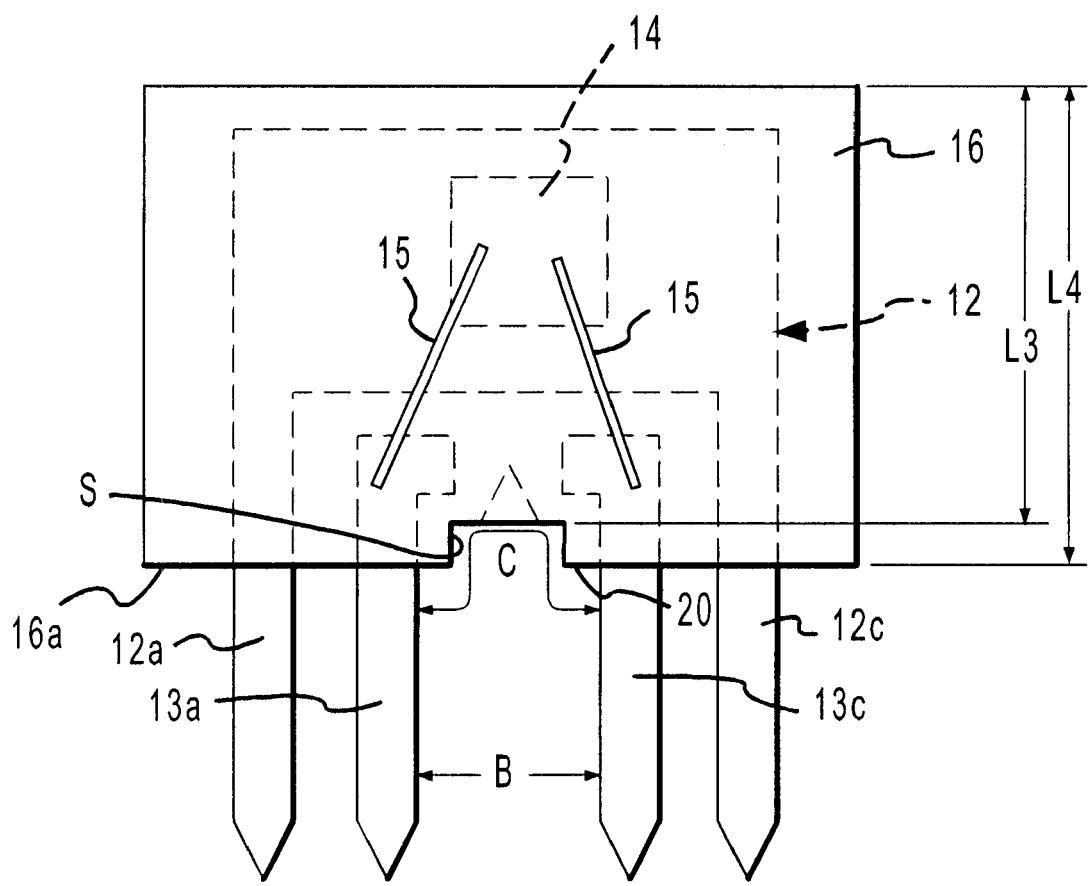
FIG. 11 is a plan view of the resin-sealed semiconductor device shown in FIG. 9 after the common portion of the lead frame is cut off.

FIG. 11 is a plan view of the resin-sealed semiconductor chip 14 with the lead frame 10 shown in FIG. 9 after the lead frame 10 is cut off. The outer peripheral surface 16a is recessed as indicated by the letter S. A length L3 of the recessed part S of the resin-seal body 16 is less than a length L4 of the other part of the resin-seal body 16.

As shown in FIG. 11, an electrically insulative material 20 (shown by a thick line in FIG. 11) may be applied to a part of the outer peripheral surface 16a between the leads 13a and 13c. In this case, the recessed part S is electrically insulated from the area therearound. Since the leads 13a are electrically insulated from each other with certainty, the withstanding voltage is improved.

When the resin-seal body 16 is recessed as defined by the part S, a creeping distance C formed of the insulative material 20 is longer than a distance B between the adjacent leads 13a and 13c. Accordingly, the electrical insulation between the leads 13a and 13c is further improved.

EXAMPLE 2

A lead frame in a second example according to the present invention will be described. Elements corresponding to those discussed with respect to FIG. 1 will bear identical reference numerals therewith and the detailed descriptions thereof will be omitted.

Figure 12:
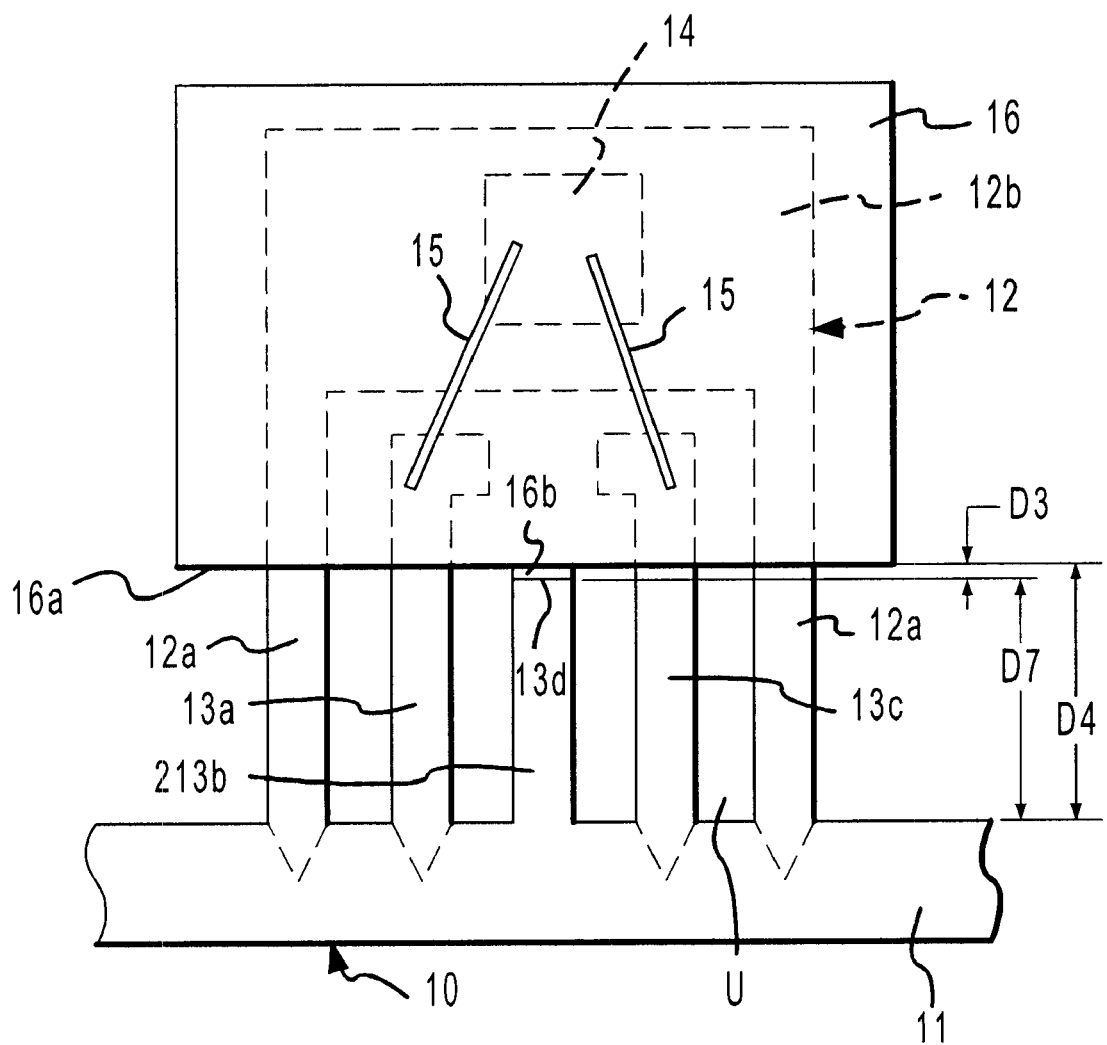
FIG. 12 is a plan view of a resin-sealed semiconductor device with a lead frame in a second example according to the present invention.

FIG. 12 is a plan view of a resin-sealed semiconductor chip 14 with a lead frame 20 in the second example according to the present invention. The lead frame 20 in this example is different from the lead frame shown in FIG. 1 in that a tip of an adjusting lead 213b is outside the resin-seal body 16.

A distance D7 between the common portion 11 and the tip of the adjusting lead 213b is shorter than a distance D4 between the common portion 11 and the outer peripheral surface 16a of the resin-seal body 16. The tip of the adjusting lead 213b is square-shaped. An end surface 13d of the tip of the adjusting lead 213b and the outer peripheral surface 16a are substantially parallel to each other. A distance D3 between the end surface 13d of the adjusting lead 213b and the outer peripheral surface 16a of the resin-seal body 16 is preferably about 0.1 mm to about 0.2 mm in order to allow the adjusting lead 213b to be removed sufficiently easily.

With reference to FIGS. 13, 14, 15A, 15B and 16, a method for resin-sealing the semiconductor chip 14 using the lead frame 20 will be described. Elements corresponding to those discussed with respect to FIG. 1 will bear identical reference numerals therewith and the detailed descriptions thereof will be omitted.

Figure 13:
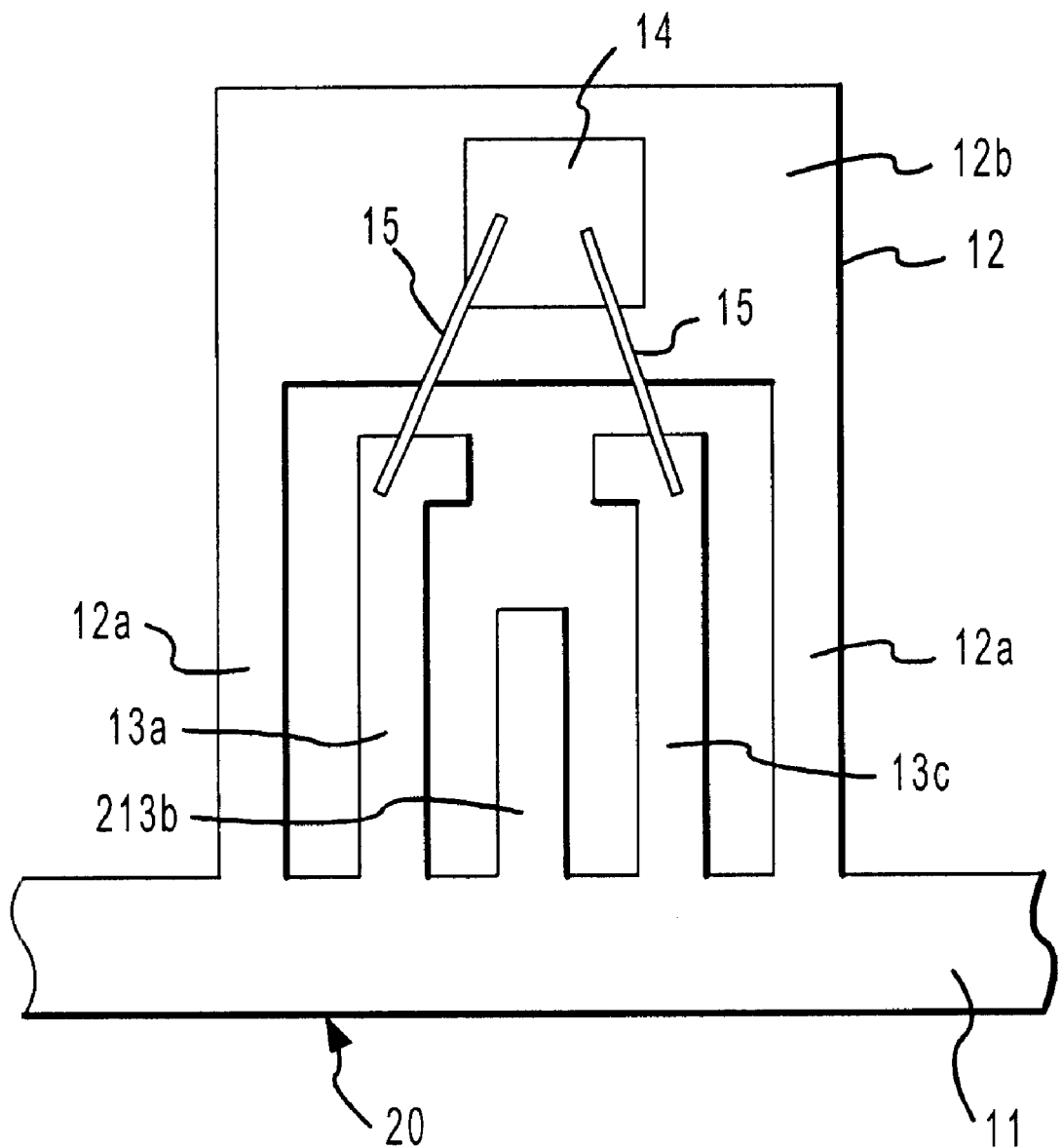
FIG. 13 is a plan view of the semiconductor chip bonded on the lead frame before being resin-sealed in the second example.
Figure 14:
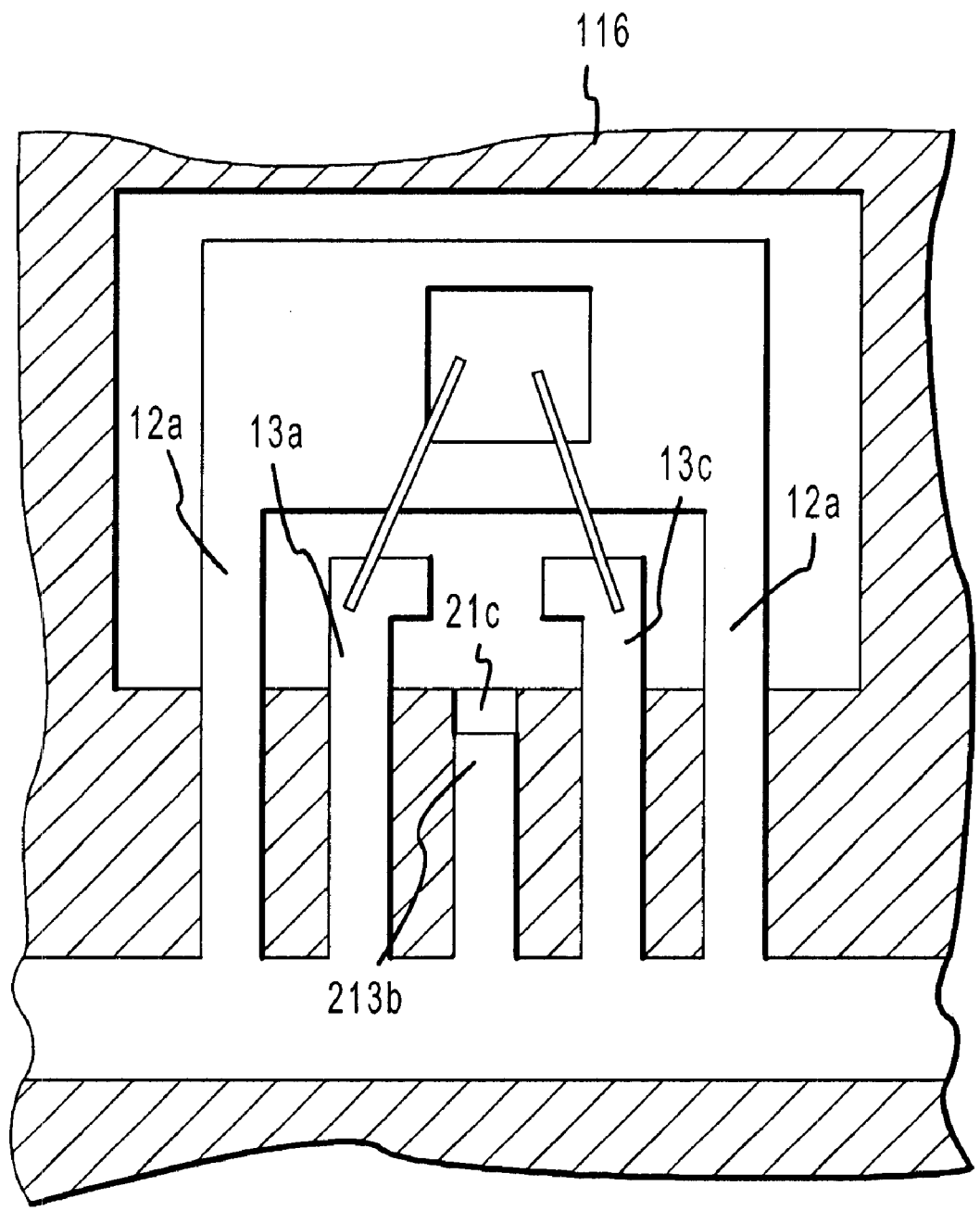
FIG. 14 is a plan view of a mold holding the semiconductor chip bonded on the lead frame during resin-sealing in the second example.
Figure 15A:
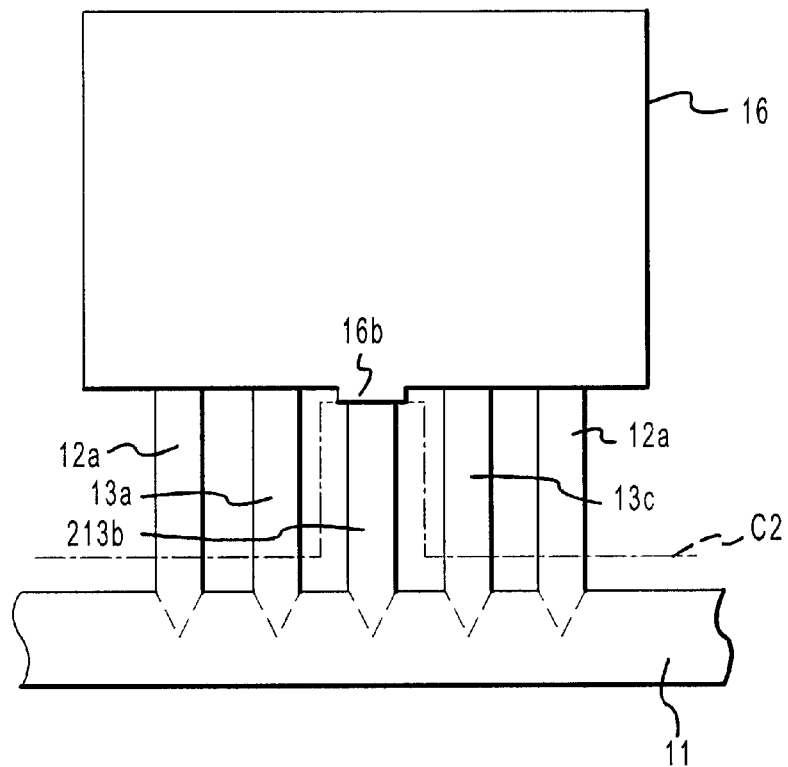
FIG. 15A is a plan view of the resin-seal body and the lead frame subsequent to being formed in the mold in the second example.
Figure 15A:
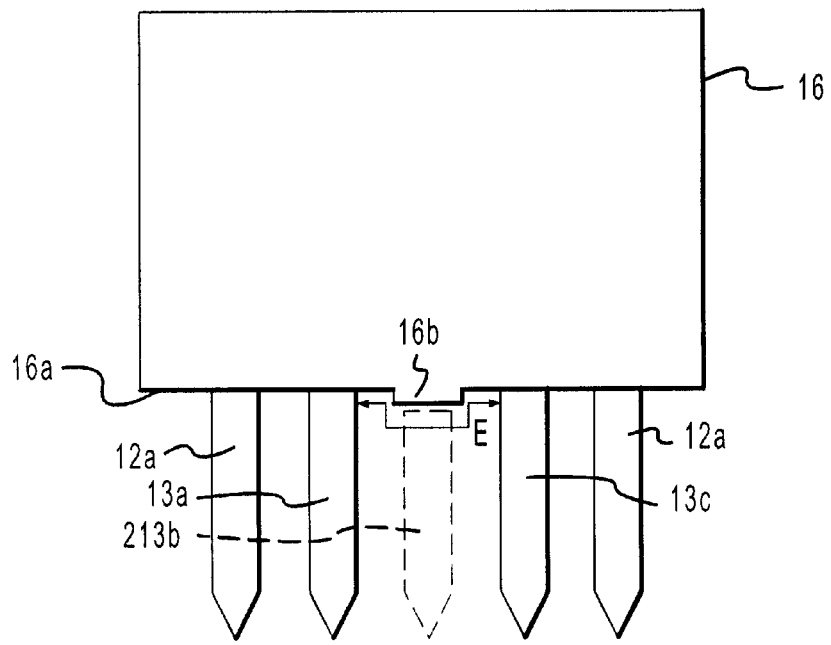
Figure 16:
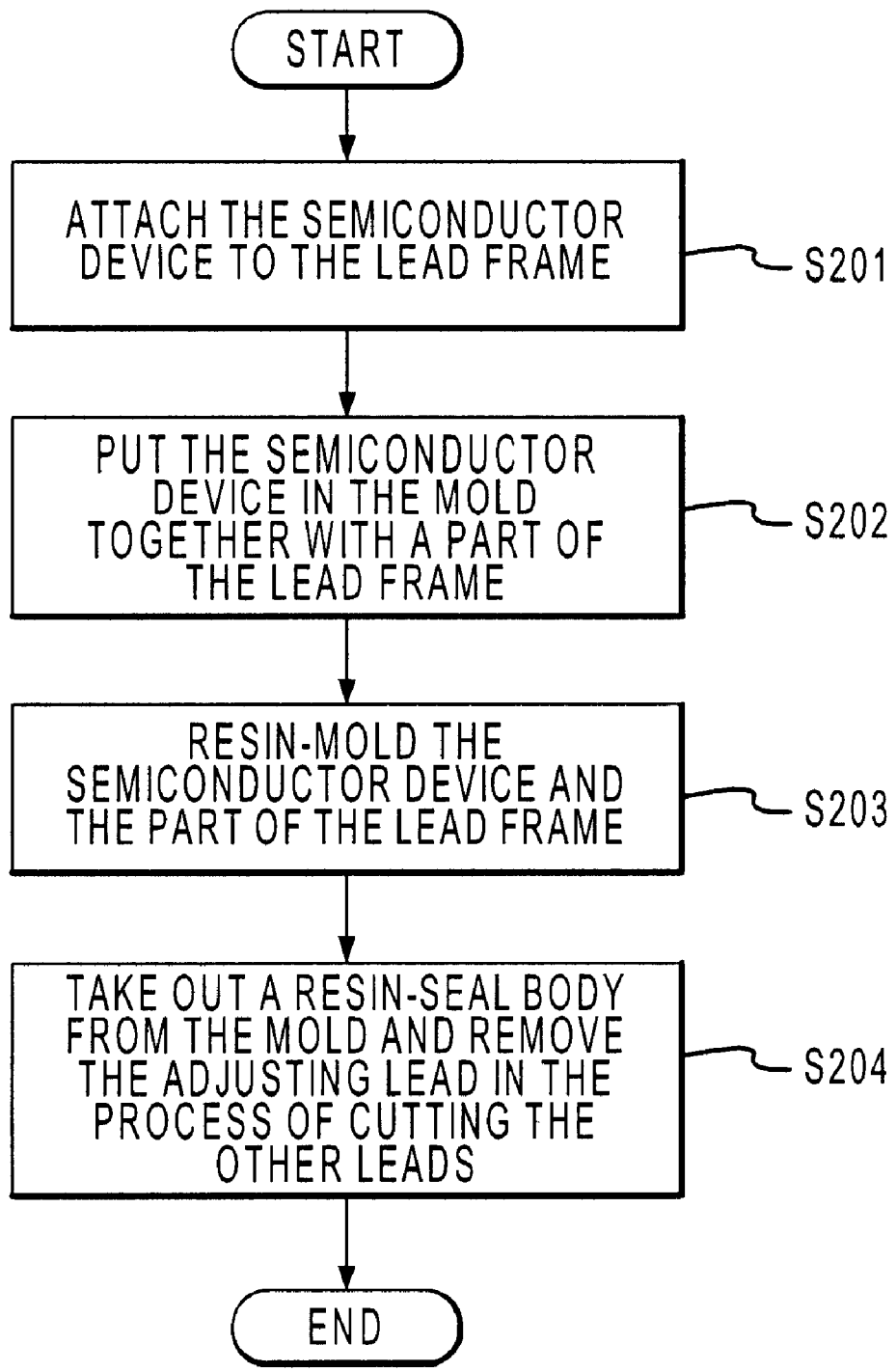
FIG. 16 is a flowchart illustrating a method for resin-sealing the semiconductor using the lead frame in the second example.

FIG. 13 is a plan view of the semiconductor chip 14 bonded on the lead frame 20 before being resin-sealed. FIG. 14 is a plan view of a mold 116 holding the semiconductor chip 14 bonded on the lead frame 20 during resin-sealing. FIG. 15A is a plan view of the resin-seal body 16 and the lead frame 20 subsequent to being formed in the mold 116 in the second example, and FIG. 15B is a plan view of a resultant resin-sealed semiconductor device after the common portion 11 of the lead frame 20 is cut off. FIG. 16 is a flowchart illustrating a method for resin-sealing the semiconductor 14 using the lead frame 20 in the second example.

Hereinafter, the method for resin-sealing the semiconductor chip 14 using the lead frame 20 will be described in accordance with FIG. 16 with reference to FIGS. 13, 14, 15A and 15B.

In step S201, the semiconductor chip 14 is attached to the die-mount portion 12b (FIG. 13). The semiconductor chip 14 is connected to the leads 13a and 13c via the thin metal wires 15.

In steps S202 and S203, resin-sealing of the semiconductor chip 14 is performed using the mold 116 including an upper mold 116a and a lower mold 116b which can be engaged together. As shown in FIG. 14, the semiconductor chip 14 and the die-mount portion 12b are held between the upper mold 116a and the lower mold 116b (S202). The leads 12a, 13a and 13c and the adjusting lead 213b are also partially held between the upper mold 116a and the lower mold 116b. In step S203, the semiconductor chip 14 and the above-mentioned parts of the lead frame 20 are molded and sealed together in the resin-seal body 16 by the mold 116.

In step S204, the resin-seal body 16 is taken out of the mold 116 as shown in FIG. 15A. Then, the leads 12a, 13a and 13c projecting from the common portion 11 are cut along chain line C2 so as to have a pierced tip as shown in FIG. 15B. The adjusting lead 213b is then blown off by air when the leads 12a, 13a and 13c are cut off. Since there is a space 21c between the resin-seal body 16 and the tip of the adjusting lead 213b, a projection 16b formed of the resin entering the space 21c is formed on the outer surface 16a of the resin-seal body 16 (FIG. 15A) after the adjusting lead 213b is removed.

In the second example, the adjusting lead 213b is removed by air during the cutting step of the common portion 11. Since air blows away the lead 213b during the cutting, the step of removing the lead 213b is eliminated. The effects described in the first example are also achieved.

Referring to FIG. 15B, in the case where an insulative material is applied to the projection 16b, a creeping distance E formed by the insulative material is larger than the distance between the leads 13a and 13c. Accordingly, the electrical insulation between the leads 13a and 13c is further improved.

The structure of the lead frame is not limited to the one described above. The structure is sufficient as long as the lead frame includes a plurality of leads arranged along at least one after surface of the resin-seal body and at least one of the plurality of leads is an adjusting lead.

EXAMPLE 3

A lead frame in a third example according to the present invention will be described. Elements corresponding to those discussed with respect to FIG. 1 will bear identical reference numerals therewith and the detailed descriptions thereof will be omitted.

Figure 17:
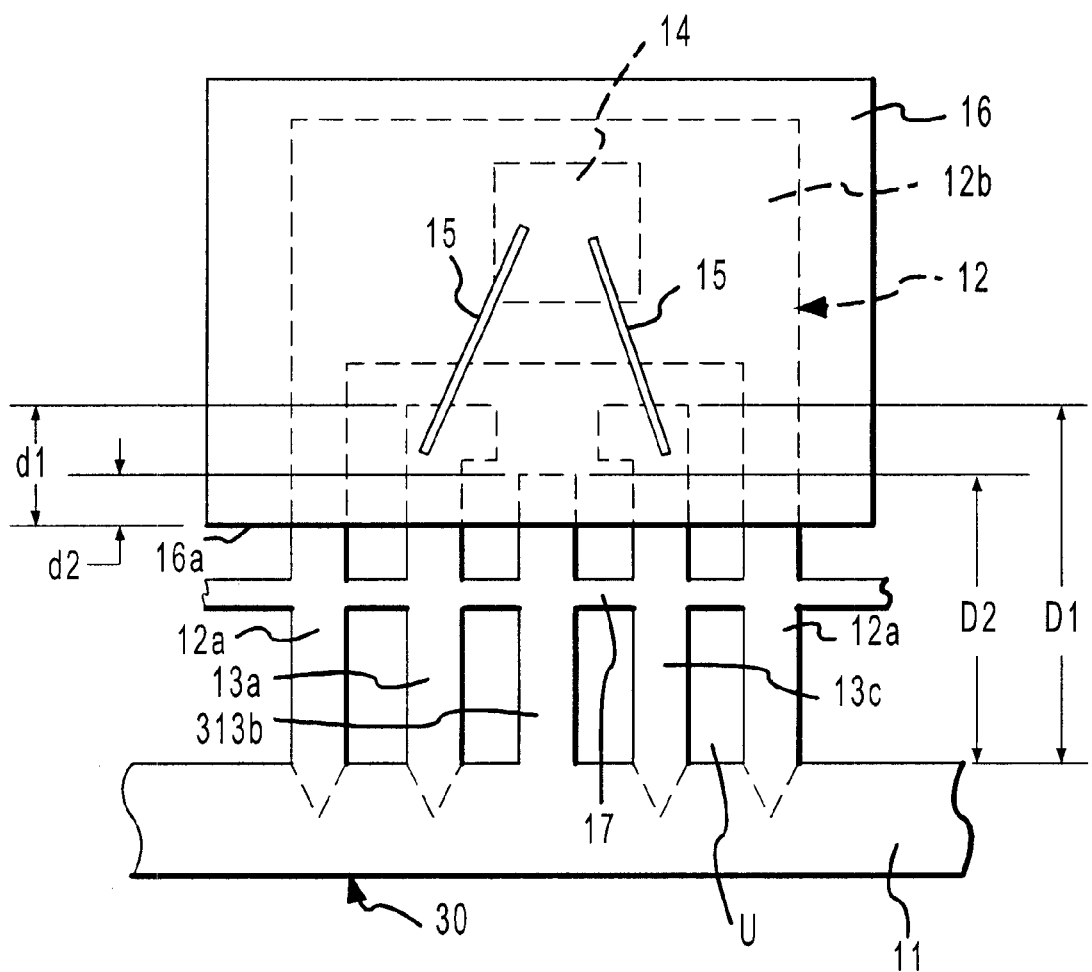
FIG. 17 is a plan view of a resin-sealed semiconductor device with a lead frame in a third example according to the present invention.

FIG. 17 is a plan view of a resin-sealed semiconductor chip 14 with a lead frame 30 in the third example according to the present invention. The lead frame 30 in this example is different from the lead frame shown in FIG. 1 in that the lead frame 30 in this example includes a tie-bar 17.

The tie-bar 17 is provided in the vicinity of the outer peripheral surface 16a of the resin-seal body 16 for connecting the leads 12a, 13a, 313b and 13c. The adjusting lead 313b projects into the resin-seal body 16. The tie-bar 17 connecting the leads 12a, 13a, 313b and 13c prevents the leads 12a, 13a, 313b and 13c from being bent.

With reference to FIGS. 18A, 18B, 19A, 19B, 19C, 19D, 20, 21 and 22, a method for resin-sealing the semiconductor chip 14 using the lead frame 30 will be described. Elements corresponding to those discussed with respect to FIG. 1 will bear identical reference numerals therewith and the detailed descriptions thereof will be omitted.

Figures 18A, 18B:
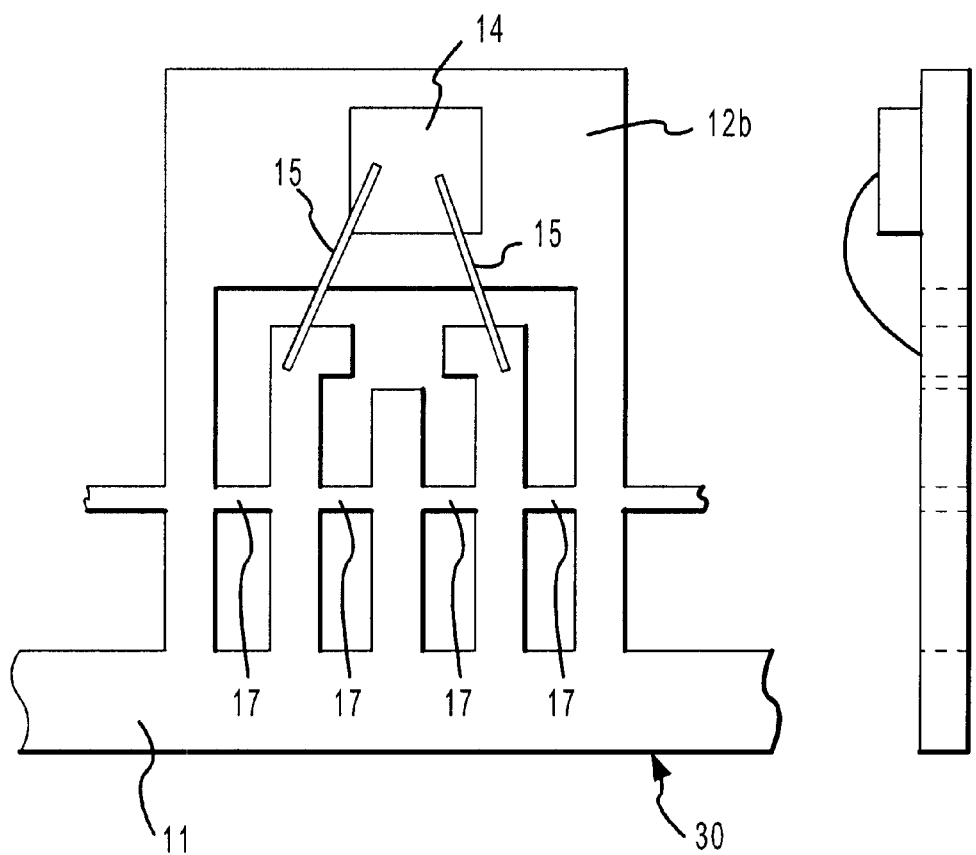
FIG. 18A is a plan view of the semiconductor chip bonded on the lead frame before being resin-sealed in the third example.
FIG. 18B is a side view of the semiconductor chip and the lead frame shown in FIG. 18A.
Figures 19A, 19B:
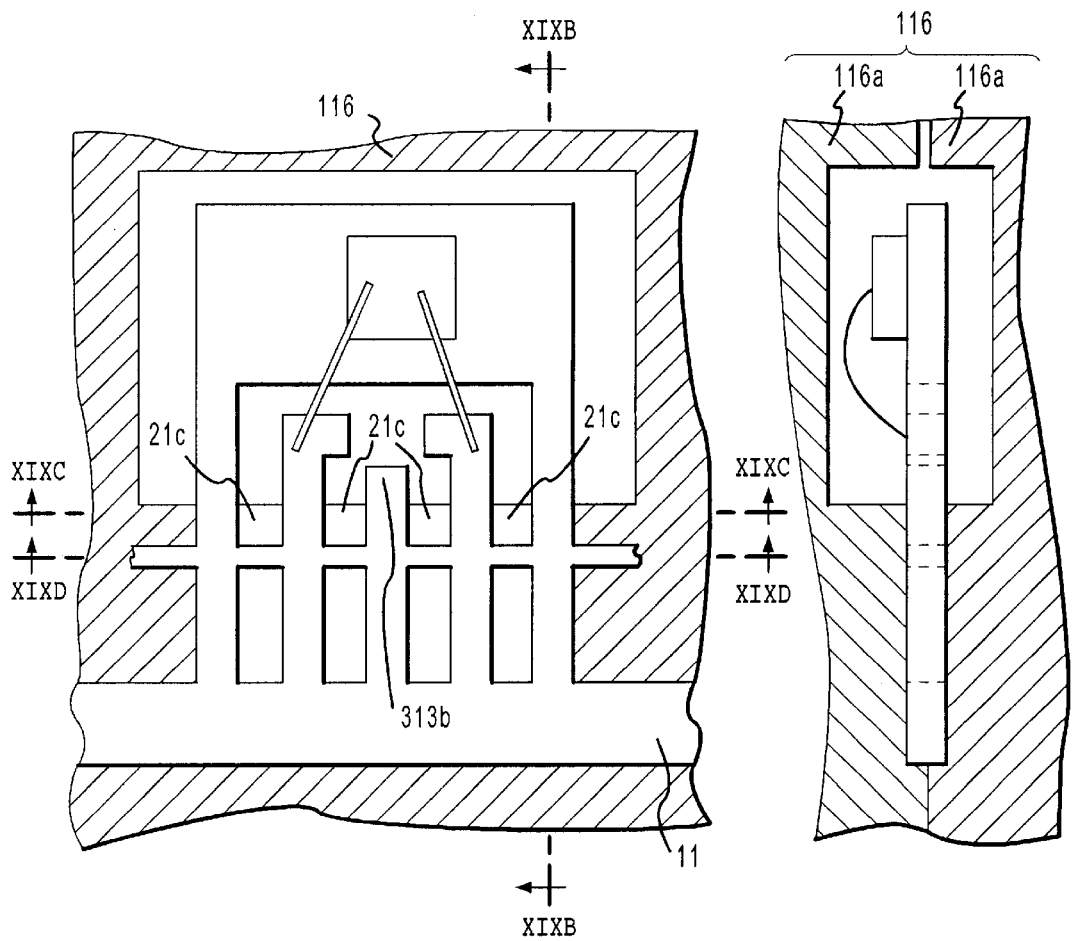
FIG. 19A is a plan view of a mold holding the semiconductor chip bonded on the lead frame during resin-sealing in the third example.
FIG. 19B is a cross-sectional view of FIG. 19A taken along line XIXB—XIXB.
Figure 19C:
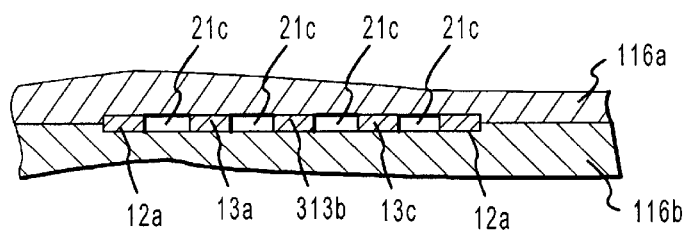
FIG. 19C is a cross-sectional view of FIG. 19A taken along line XIXC—XIXC.
Figure 19D:
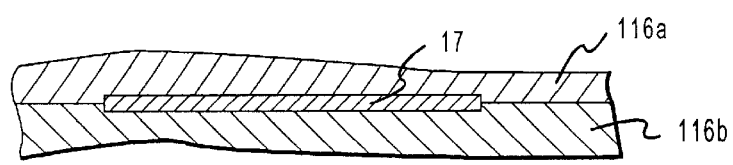
FIG. 19D is a cross-sectional view of FIG. 19A taken along line XIXD—XIXD.
Figure 20:
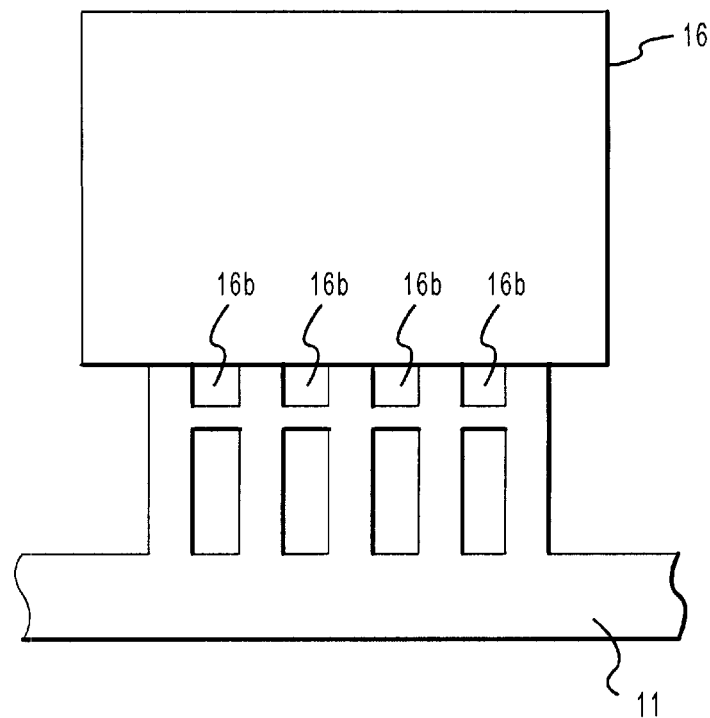
FIG. 20 is a plan view of the resin-seal body with the lead frame subsequent to being formed in a mold in the third example.
Figure 21:
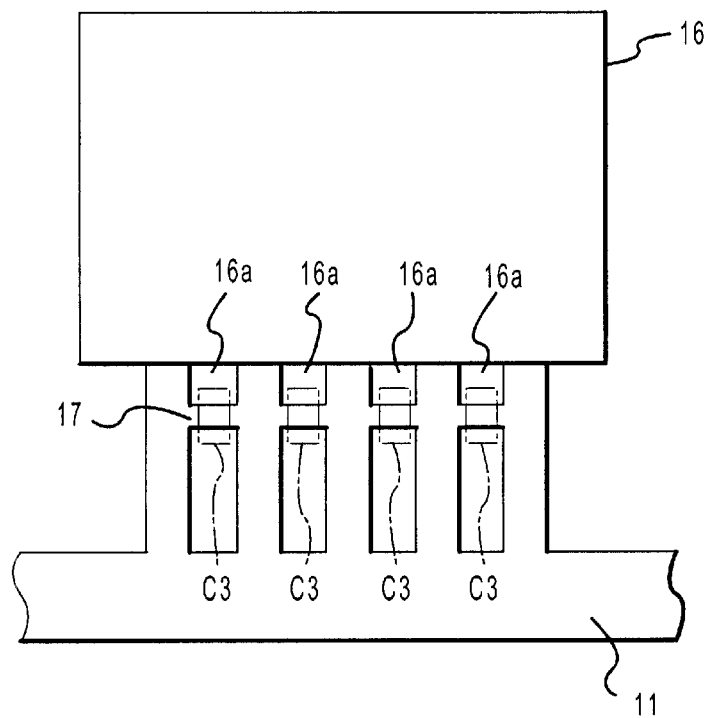
FIG. 21 is a plan view of the resin-seal body illustrating the step of cutting off the common portion of the lead frame in the third example.
Figure 22:
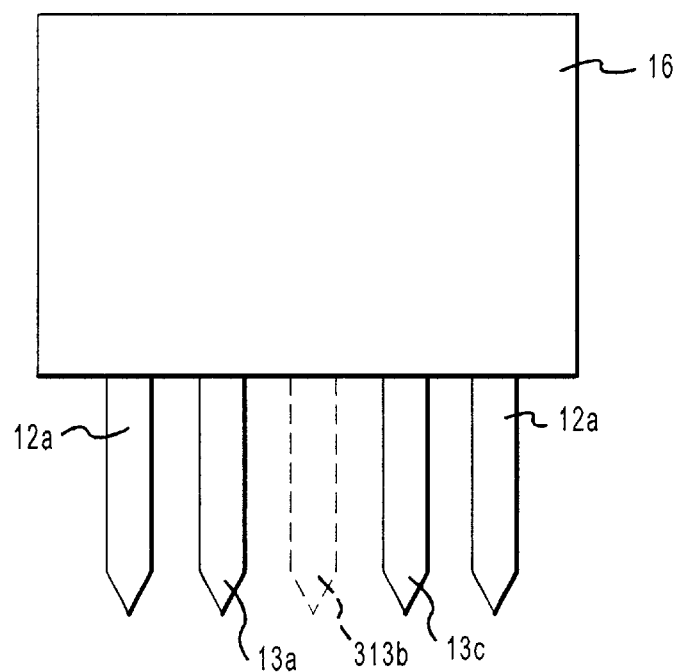
FIG. 22 is a plan view of a resultant resin-sealed semiconductor device after the common portion of the lead frame is cut off in the third example.

FIG. 18A is a plan view of the semiconductor chip 14 bonded on the lead frame 30 before being resin-sealed, and FIG. 18B is a side view of the semiconductor chip 14 and the lead frame 30 shown in FIG. 18A. FIG. 19A is a plan view of a mold 116 holding the semiconductor chip 14 bonded on the lead frame 30 during resin-sealing, FIG. 19B is a cross-sectional view thereof taken along line XIXB—XIXB of FIG. 19A, FIG. 19C is a cross-sectional view thereof taken along line XIXC—XIXC of FIG. 19A, and FIG. 19D is a cross-sectional view thereof taken along line XIXD—XIXD of FIG. 19A. FIG. 20 is a plan view of the resin-seal body 16 with the lead frame 30 subsequent to being formed in a mold, and FIG. 21 is a plan view of the resin-seal body illustrating the step of cutting off the common portion of the lead frame. FIG. 22 is a plan view of a resultant semiconductor device after the common portion 11 of the lead frame 30 is cut off.

As in the first example, resin-sealing of the semiconductor chip 14 is performed using the mold 116 including an upper mold 116a and a lower mold 116b which can be engaged together. As shown in FIG. 19A, 19B, 19C and 19D, the mold 116 produces the resin-seal body 16 while holding the leads 12a, 13a and 13c and the adjusting lead 313b between the upper mold 116a and the lower mold 116b.

In the third example, resin enters a space 21c shown in FIG. 19C by the thickness of the common portion 11 (about 0.1 mm to about 0.5 mm). Accordingly, as shown in FIG. 20, the resin-sealed body 16 includes projections 16b after completion of the resin-molding.

As shown in FIG. 21, the tie-bar 17 is cut off along chain line C3. In the same step, the projections 16b may be cut off.

As shown in FIG. 22, after the tie-bar 17 and the projections 16b cut off, the adjusting lead 313b is pulled out from the resin-seal body 16. The adjusting lead 313b, which projects into the resin-seal body 16 by a smaller distance than the leads 12a, 13a and 13c, is pulled out with sufficient ease.

As can be appreciated from the above description, the provision of the tie-bar 17 prevents the lead from being bent. This is advantageous in QFP-type (quad flat package-type) ICs described below. The effects described in the first example are also achieved.

EXAMPLE 4

A lead frame in a fourth example according to the present invention will be described. Elements corresponding to those discussed with respect to FIG. 1 will bear identical reference numerals therewith and the detailed descriptions thereof will be omitted.

Figure 23:
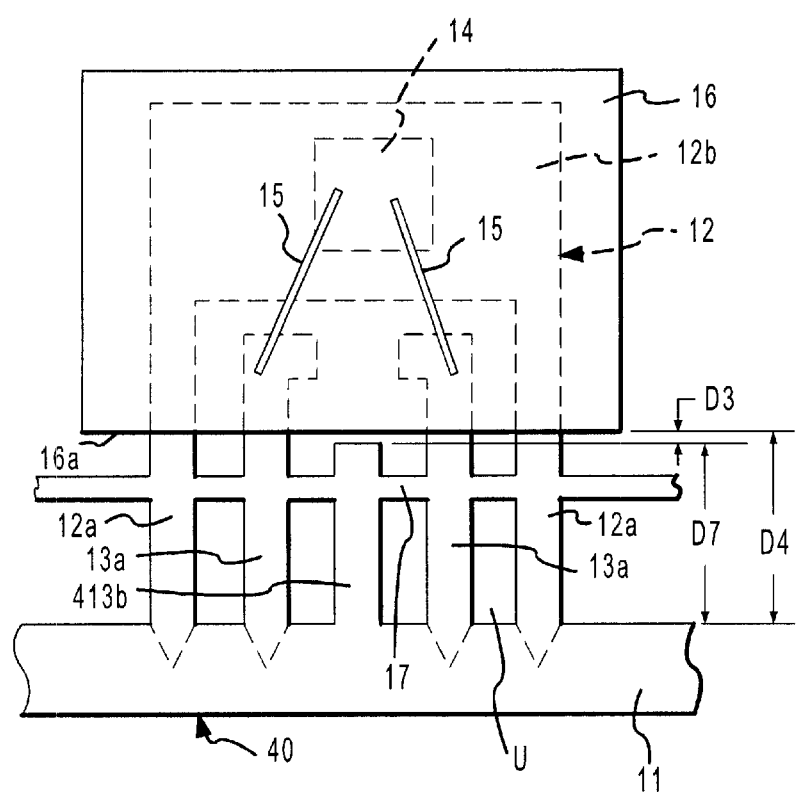
FIG. 23 is a plan view of a resin-sealed semiconductor device in a fourth example according to the present invention.

FIG. 23 is a plan view of a semiconductor chip 14 resin-sealed with a lead frame 40 in the fourth example according to the present invention. The lead frame 40 in this example is different from the lead frame shown in FIG. 1 in that a tip of an adjusting lead 413b is outside the resin-seal body 16 and that the lead frame 40 includes a tie-bar 17.

The distance D7 between the common portion 11 and the tip of the adjusting lead 413b is shorter than the distance D4 between the common portion 11 and the outer peripheral surface 16a of the resin-seal body 16. The distance D3 between the tip of the adjusting lead 413b and the outer peripheral surface 16a of the resin-seal body 16 is preferably about 0.1 mm to about 0.2 mm in order to allow the adjusting lead 413b to be removed sufficiently easily. The tie-bar 17 connects the leads 12a, 13a, 413b and 13c.

With reference to FIGS. 24, 25, 26A and 26B, a method for resin-sealing the semiconductor chip 14 using the lead frame 40 will be described. Elements corresponding to those discussed with respect to FIG. 1 will bear identical reference numerals therewith and the detailed descriptions thereof will be omitted.

Figure 24:
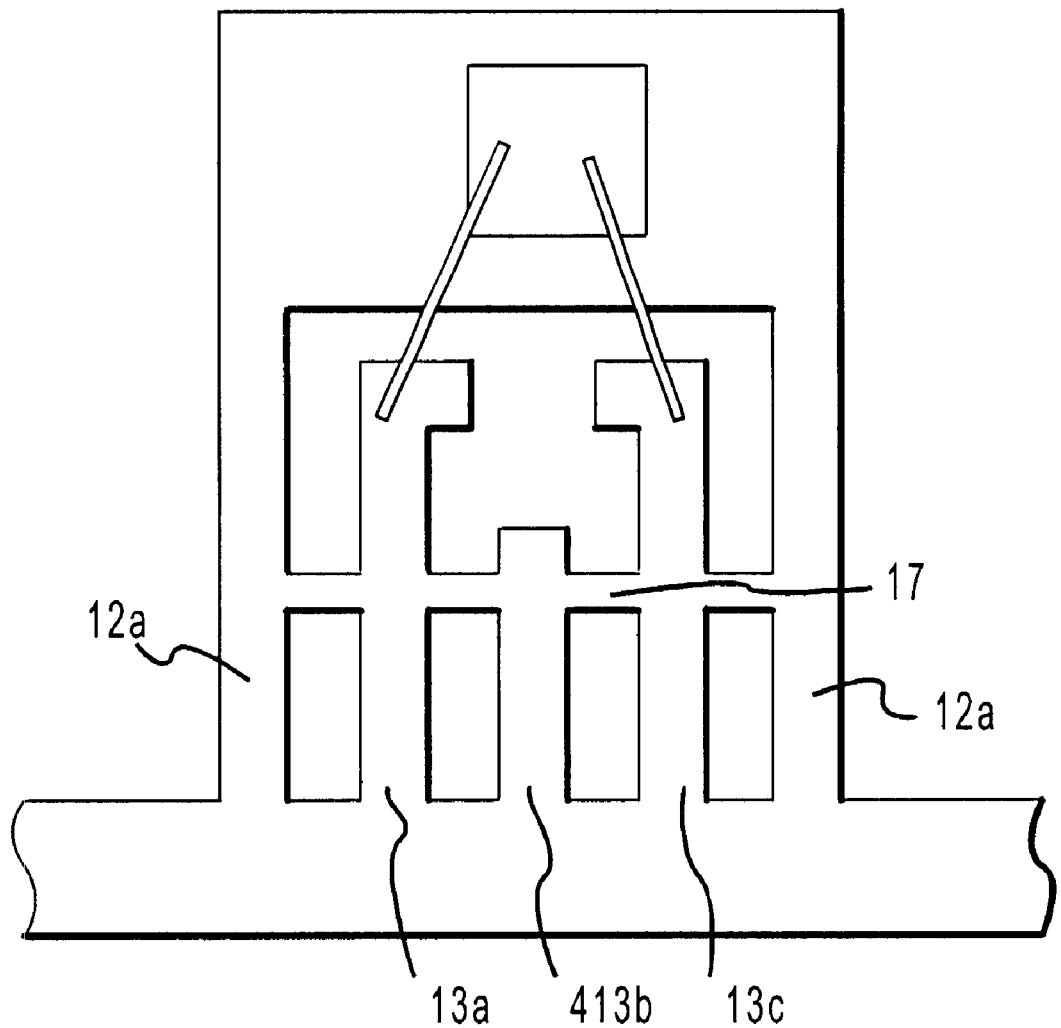
FIG. 24 is a plan view of a semiconductor chip bonded on the lead frame before being resin-sealed in the fourth example.
Figure 25:
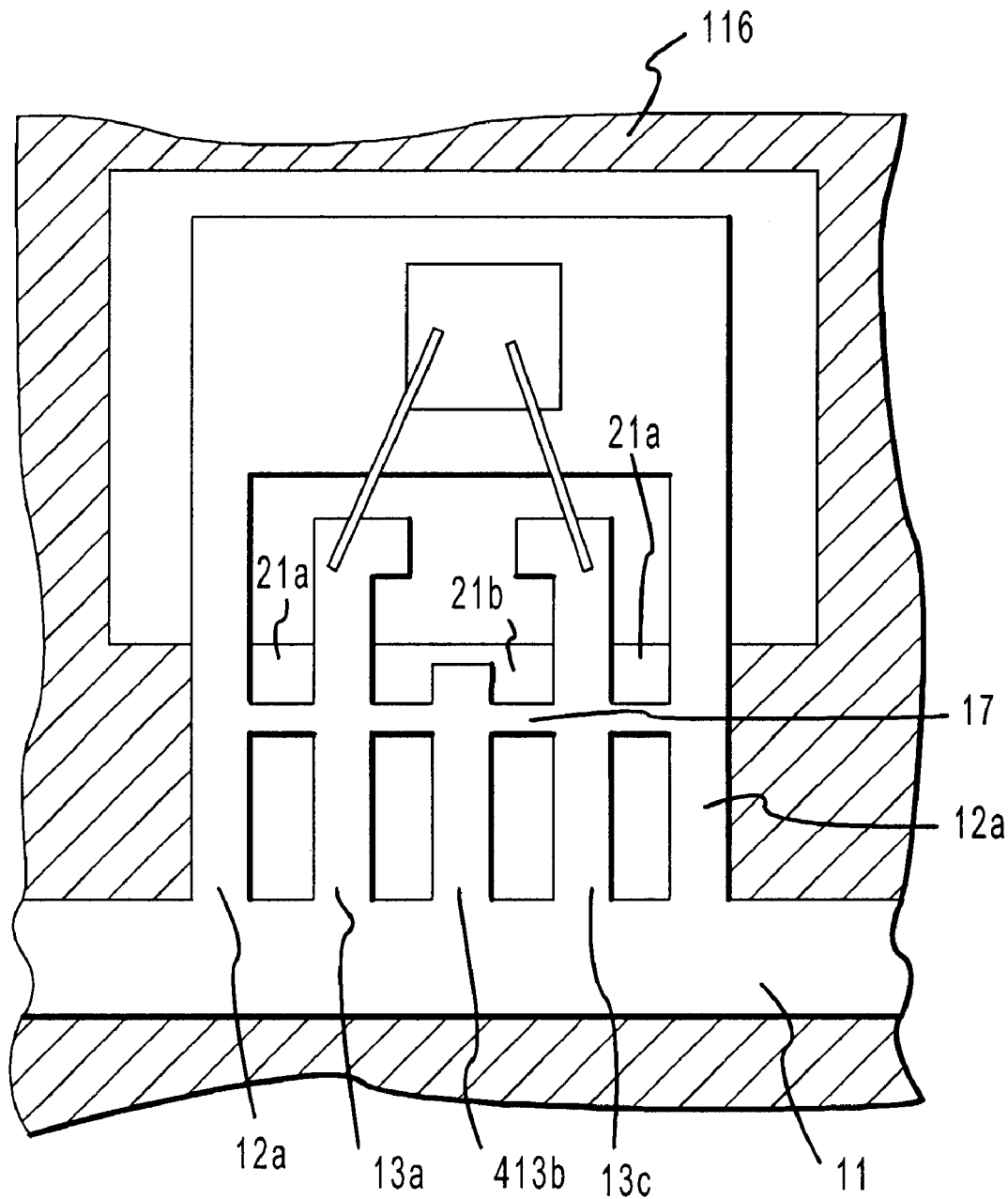
FIG. 25 is a plan view of a mold holding the semiconductor chip bonded on the lead frame during resin-sealing in the fourth example.
Figure 26A:
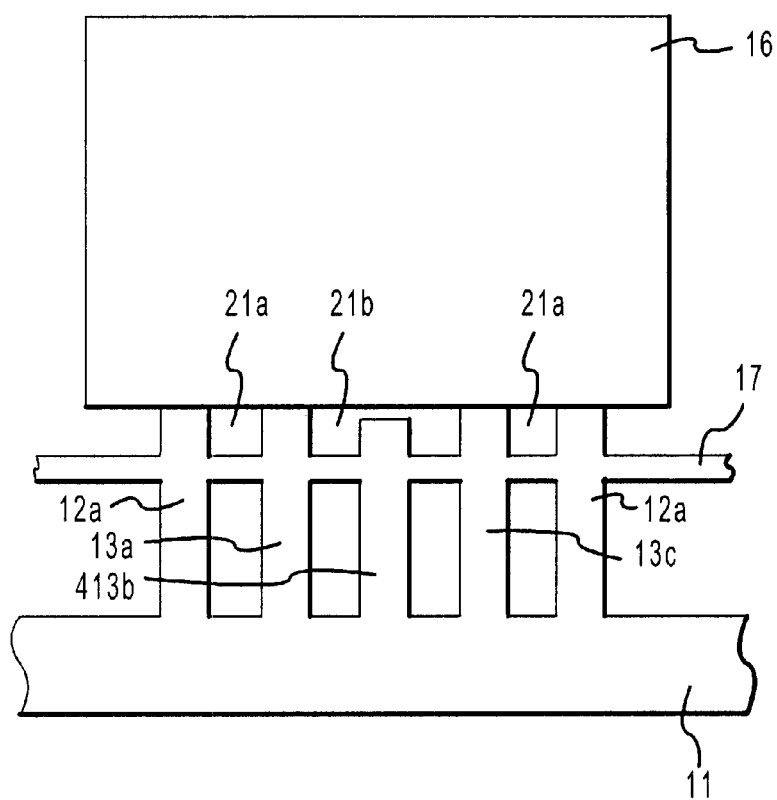
FIG. 26A is a plan view of the resin-seal body and the lead frame subsequent to being formed in a mold in the fourth example.
Figure 26B:
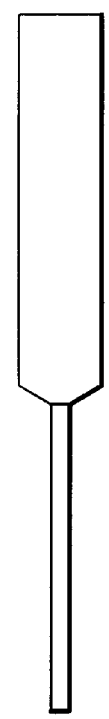
FIG. 26B is a side view of FIG. 26A.

FIG. 24 is a plan view of the semiconductor chip 14 bonded on the lead frame 40 before being resin-sealed. FIG. 25 is a plan view of a mold 116 holding the semiconductor chip 14 bonded on the lead frame 40 during resin-sealing process. FIG. 26A is a plan view of the resin-seal body 16 and the lead frame 40 subsequent to being formed in the mold 116 in the fourth example, and FIG. 26B is a side view of FIG. 26A.

As in the first example, resin-sealing of the semiconductor chip 14 is performed using the mold 116. The mold 116 produces the resin-seal body 16 while holding the leads 12a, 13a and 13c and the adjusting lead 413b.

In the fourth example, resin enters spaces 21a and 21b shown in FIG. 25 by the thickness of the common portion 11 (about 0.1 mm to about 0.5 mm). Accordingly, the resin-sealed body 16 includes projections after completion of resin-molding. The projections are cut off together with the tie-bar 17 after the resin-sealing in the same manner as in the third example.

Figure 27:
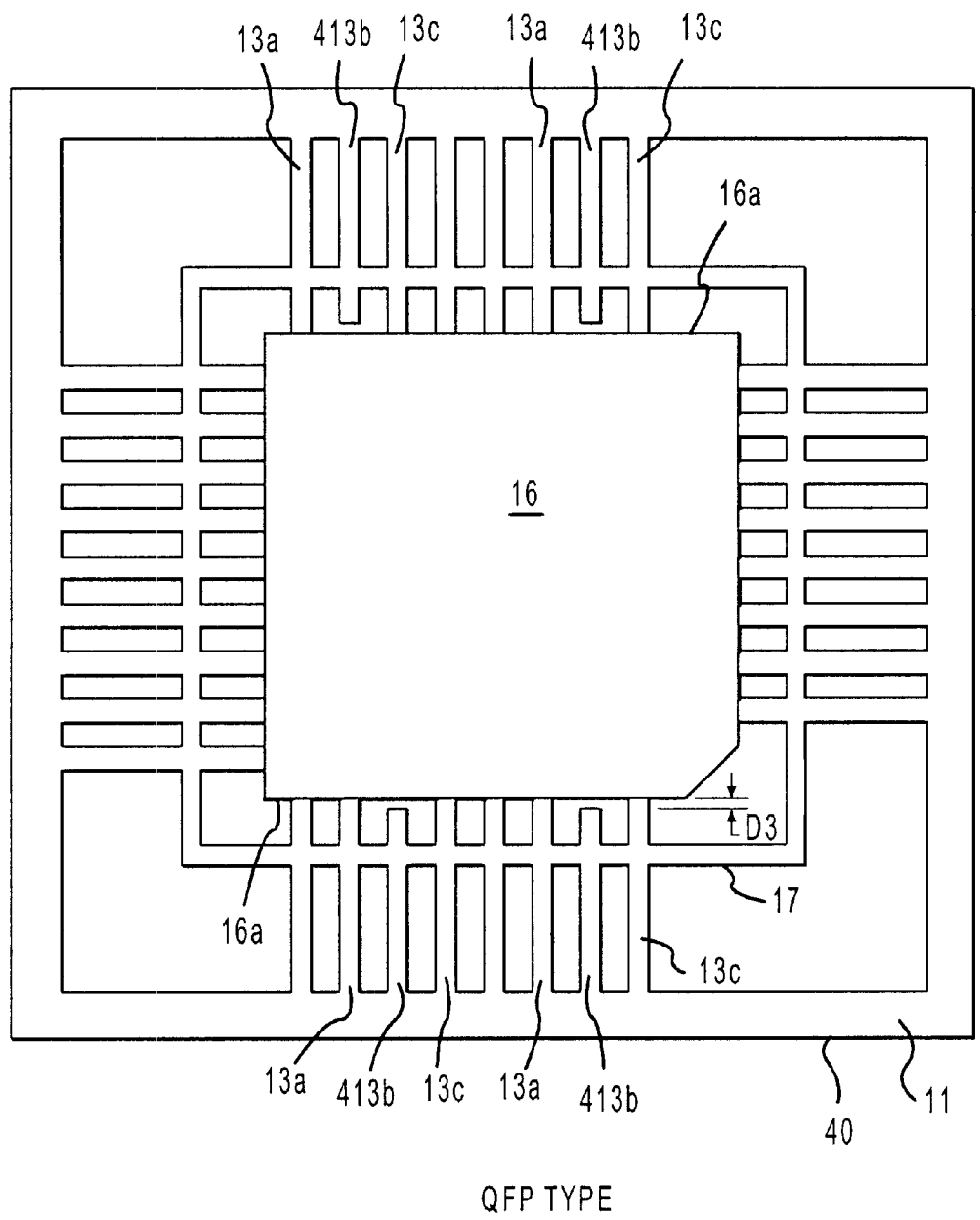
FIG. 27 is a plan view of a semiconductor device having a large number of pins which is resin-sealed using a lead frame having adjusting leads in the fourth example.

FIG. 27 is a plan view of a semiconductor device (QFP-type IC) having a large number of pins which is resin-sealed using a lead frame 40 having adjusting leads 413b. The tip of each lead 413b is outside a resin-sealed body 16. The lead frame 40 includes a tie-bar 17 for connecting the leads to prevents the leads from being bent.

As described above, in the fourth example, the provision of the tie-bar 17 prevents the lead from being bent. The effects described in the first and second examples are also achieved.

EXAMPLE 5

A lead frame in a fifth example according to the present invention will be described. Elements corresponding to those discussed with respect to FIG. 1 will bear identical reference numerals therewith and the detailed descriptions thereof will be omitted.

Figure 28:
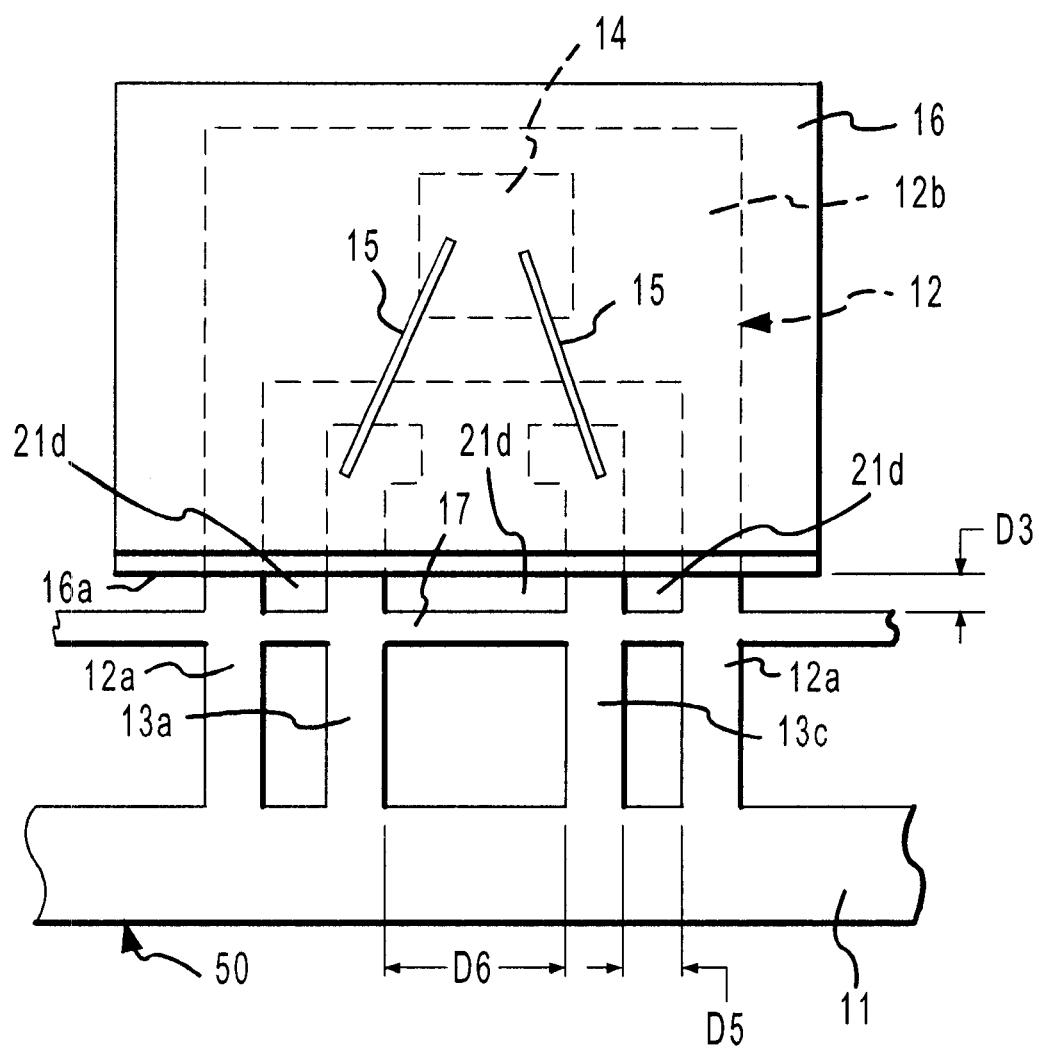
FIG. 28 is a plan view of a resin-sealed semiconductor device with a lead frame in a fifth example according to the present invention.
Figure 29:
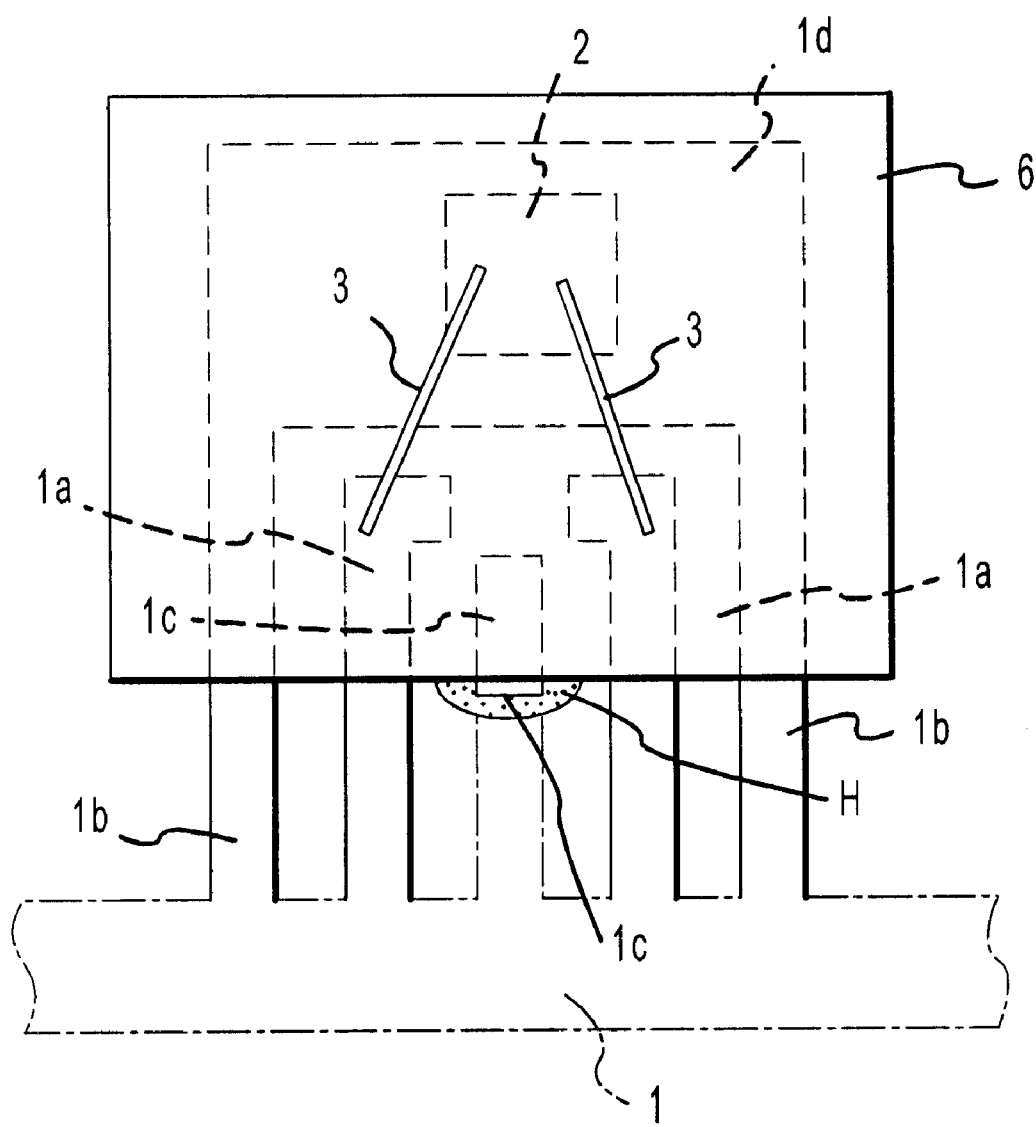
FIG. 29 is a plan view of a conventional lead frame for resin-sealing a semiconductor chip.

FIG. 28 is a plan view of a semiconductor chip 14 resin-sealed with a lead frame 50 in the fifth example according to the present invention. The lead frame 50 shown in FIG. 28 does not have an adjusting lead.

The lead frame 50 includes a common portion 11, two leads 13a and 13c spaced apart from each other by a distance D6, which is greater than twice a distance D5 between the lead 13a or 13c and the adjacent lead 12a thereto, and a tie-bar 17 provided in the vicinity of the outer peripheral surface 16a of the resin-seal body 16. The tie-bar 17 connects the leads 12a, 13a and 13c and thus prevent the leads 12a, 13a and 13c from being bent.

The outer peripheral surface 16 has projections (not shown) formed by the resin entering spaces 21d between the resin-seal body 16 and the tie-bar 17.

Since the lead frame 50 in the fifth example does not include any adjusting lead, the step of removing the adjusting lead 13b is eliminated. After completion of the resin-sealing, only the tie-bar 17 is cut off.

According to the present invention, the tip of the adjusting lead (e.g., 113b) is located at a position which is sufficiently proximate to the outer peripheral surface 16a of the resin-seal body 16 to avoid a resin to flash from the adjusting lead 113b while the semiconductor chip 14 is resin-sealed and also sufficiently proximate to the outer peripheral surface 16a to allow the adjusting lead 113b to be removed from the resin-seal body 16 after the semiconductor chip 14 is resin-sealed with ease.

The lead frame according to the present invention can be used for resin-sealing various types of semiconductor chips without causing an unnecessary part thereof to remain in the resin-seal body.

Therefore, the withstanding voltage of the resin-sealed semiconductor devices using such a lead frame is not lowered.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a resin-sealed semiconductor device, the method comprising the steps of:

incorporating a portion of a lead frame in a mold for producing a resin-seal body which surrounds the portion of the lead frame in the resin-seal body, the lead frame including a plurality of leads arranged along at least one outer peripheral surface of the mold, wherein the plurality of leads include at least one adjusting lead, and the adjusting lead has a length that is less than the others of the plurality of leads such that a tip of the adjusting lead is sufficiently proximate to an outer peripheral surface of the resin-seal body to prevent resin flash during a formation of the semiconductor device and to allow the adjusting lead to be removed after the resin-seal body is formed over the portion of the lead frame;

resin-sealing the semiconductor device together with the portion of the lead frame by the mold to form a resin-seal body;

taking out the resin-seal body from the mold; and removing the at least one adjusting lead from the resin-seal body.

2. A method for producing a resin-sealed semiconductor body according to claim 1, further comprising the step of:

cutting the plurality of leads, wherein the adjusting lead of the lead frame projects into the resin-seal body.

3. A method for producing a resin-sealed semiconductor body according to claim 1, further comprising the step of:

cutting the plurality of leads, wherein a tip of the adjusting lead is located at one of a position outside the outer peripheral surface of the resin-seal body and a position in contact with the outer peripheral surface of the resin-seal body.

4. A method for producing a resin-sealed semiconductor device, the method comprising the steps of:

incorporating a portion of a lead frame in a mold for producing a resin-seal body which surrounds the portion of the lead frame in the mold, wherein the lead frame including a plurality of leads arranged along at least one outer peripheral surface of the resin-seal body and a tie-bar for transversely connecting the plurality of leads, thereby substantially preventing a bending of the plurality of leads;

resin-sealing the semiconductor device together with the portion of the lead frame by the mold to form a resin-seal body having a projection of the other peripheral surface that contacts the tie-bar;

taking out the resin-seal body from the mold; and removing the tie-bar to leave the projection on the outer peripheral surface of the resin-seal body.

5. A resin-sealed semiconductor device produced by the method according to claim 2.

6. A resin-sealed semiconductor device produced by the method according to claim 3.

7. A resin-sealed semiconductor device produced by the method according to claim 4.

8. A method for producing a resin-sealed semiconductor device, the method comprising the steps of:

aligning a lead frame with an adjusting lead in a semiconductor mold, wherein the lead frame comprises a plurality of adjacent leads arranged along a common side of the lead frame, and wherein the plurality of leads includes at least one adjusting lead;

resin-sealing a portion of the lead frame in a resin-seal body;

removing the resin-seal body from the semiconductor mold; and removing the adjusting lead from the resin-seal body.

9. A method for producing a resin-sealed semiconductor device according to claim 8, wherein a tip of at least one lead of the plurality of leads which projects into said resin-seal body is configured to prevent removal of the lead from the resin-seal body.

10. A method for producing a resin-sealed semiconductor device according to claim 8, wherein a tip of at least one lead of the plurality of leads which projects into the resin-seal body is formed at an angle with a portion of the lead extending from the resin-seal body.

11. A method for producing a resin-sealed semiconductor device according to claim 8, wherein a tip of the adjusting lead is positioned in said resin-seal body sufficiently close to an outer peripheral surface of the resin-seal body such that the adjusting lead may be removed from the resin-seal body without damaging the resin-sealed semiconductor device.

12. A method for producing a resin-sealed semiconductor device according to claim 8, wherein a tip of the adjusting lead is positioned in the resin-seal body sufficiently close to an outer peripheral surface of the resin-seal body to prevent resin flash.

13. A method for producing a resin-sealed semiconductor device according to claim 8, wherein the mold is configured with a protrusion which forms a recessed surface in the resin-seal body.

14. A method for producing a resin-sealed semiconductor device according to claim 8, wherein a tip of the adjusting lead is squared.

15. A method for producing a resin-sealed semiconductor device according to claim 8, wherein a tip of the adjusting lead is tapered.

16. A method for producing a resin-sealed semiconductor device according to claim 8, wherein a tip of the adjusting lead is rounded.

17. A method for producing a resin-sealed semiconductor device, the method comprising the steps of:

aligning a lead frame in a semiconductor mold, wherein the lead frame comprises a plurality of adjacent leads arranged along a common side of the lead frame, and wherein the plurality of leads includes at least one adjusting lead;

resin-sealing a portion of the lead frame in a resin-seal body, wherein the resin-sealing step leaves the adjusting lead exterior to the resin-seal body; and removing the resin-seal body from the semiconductor mold.

* * * * *